US012757644B2

(12) United States Patent
Li et al.

(10) Patent No.: US 12,757,644 B2
(45) Date of Patent: Oct. 6, 2026

(54) SEMICONDUCTOR DEVICE WITH PHASE-CHANGE MATERIAL AND METHOD FOR MANUFACTURING THEREOF

(71) Applicant: Taiwan Semiconductor Manufacturing Company, Ltd., Hsin-Chu (TW)

(72) Inventors: Hung-Ju Li, Hsinchu City (TW); Yu-Wei Ting, Taipei City (TW); Tsung-Hao Yeh, Hsinchu City (TW); Kuo-Pin Chang, Zhubei City (TW); Kuo-Ching Huang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 660 days.

(21) Appl. No.: 18/302,430

(22) Filed: Apr. 18, 2023

(65) Prior Publication Data

US 2024/0357948 A1 Oct. 24, 2024

(51) Int. Cl.

| | |
|---|---|
| ***H10N 70/00*** | (2023.01) |
| ***H10N 70/20*** | (2023.01) |
| ***H10N 79/00*** | (2026.01) |

(52) U.S. Cl.

CPC ......... *H10N 70/823* (2023.02); *H10N 70/063* (2023.02); *H10N 70/231* (2023.02); *H10N 70/8613* (2023.02); *H10N 79/00* (2023.02)

(58) Field of Classification Search

CPC . H10N 70/823; H10N 70/231; H10N 70/8613

See application file for complete search history.

(56) References Cited

U.S. PATENT DOCUMENTS

| | | | | |
|---|---|---|---|---|
| 9,142,763 | B2 | 9/2015 | Hurkx | |
| 10,529,515 | B2 | 1/2020 | Navarro et al. | |
| 10,741,758 | B2 * | 8/2020 | Howard | H10N 70/841 |
| 2007/0096248 | A1 | 5/2007 | Philipp et al. | |
| 2016/0079019 | A1 * | 3/2016 | Borodulin | H10N 70/231 337/396 |
| 2020/0044148 | A1 * | 2/2020 | Trinh | H10N 70/063 |
| 2020/0058706 | A1 | 2/2020 | El-Hinnawy et al. | |
| 2020/0395537 | A1 * | 12/2020 | Ok | H10N 70/066 |

(Continued)

FOREIGN PATENT DOCUMENTS

| | | |
|---|---|---|
| CN | 113517394 A | 10/2021 |
| CN | 114566591 A | 5/2022 |
| CN | 115867124 A | 3/2023 |

*Primary Examiner* — Mounir S Amer

(74) *Attorney, Agent, or Firm* — HAYNES AND BOONE, LLP

(57) ABSTRACT

Device structures and methods for forming the same are provided. A semiconductor structure according to the present disclosure includes a first electrode and a second electrode disposed over a substrate, a heating element disposed over the substrate, a phase-change material layer disposed over the substrate, and an insulator disposed vertically between the heating element and the phase-change material layer. The phase-change material layer includes at least a first segment and a second segment separated from the first segment. Each of the first and second segments overlaps the heating element in a top view. Each of the first and second segments is electrically connected with both the first and second electrodes.

20 Claims, 23 Drawing Sheets

(56) References Cited

U.S. PATENT DOCUMENTS

| | | | | |
|---|---|---|---|---|
| 2021/0280637 | A1 | 9/2021 | Taddiken et al. | |
| 2022/0416162 | A1* | 12/2022 | Philip | H10N 70/8828 |
| 2023/0337554 | A1* | 10/2023 | Wohlmuth | H10N 79/00 |
| 2023/0343531 | A1* | 10/2023 | Solomko | H01H 37/14 |
| 2024/0023468 | A1* | 1/2024 | Fleury | H10N 70/011 |

* cited by examiner

SEMICONDUCTOR DEVICE WITH PHASE-CHANGE MATERIAL AND METHOD FOR MANUFACTURING THEREOF

BACKGROUND

In recent years, semiconductor devices based on phase-change material (PCM) have emerged, such as in the field of phase-change memory devices as promising alternatives of nonvolatile memory (NVM) devices and in the field of radio frequency (RF) communication with the need for RF switching devices. The core of a PCM structure is a phase-change element that exhibits a switching behavior between a high resistance amorphous phase and a low resistance crystalline phase. While existing PCM structures and processes for forming the same are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
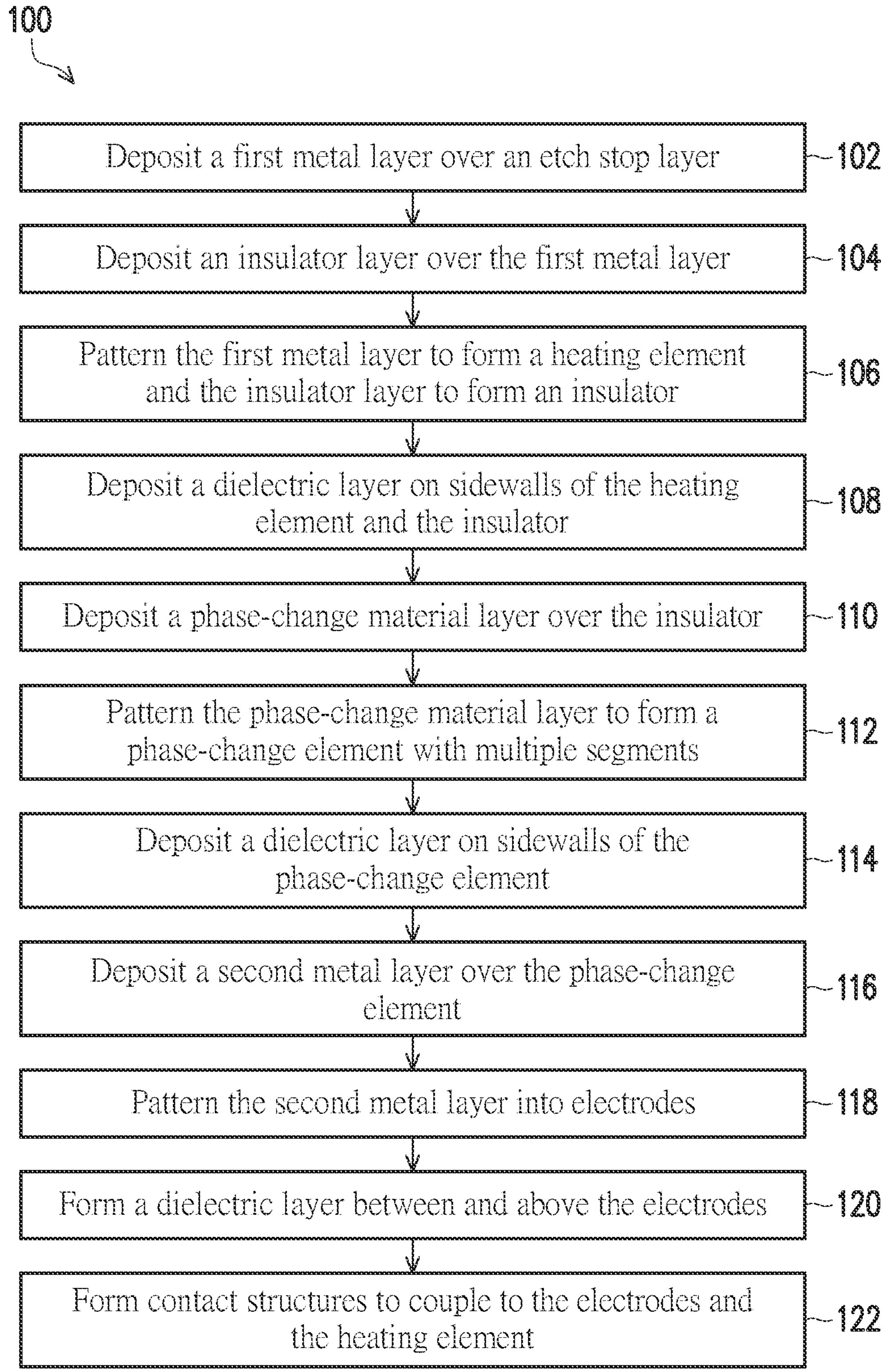
FIG. 1 illustrates a flow chart of a method 100 of forming a PCM structure, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for case of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices (or structures) based on phase-change material (PCM) and methods of forming the same. PCM structures are based on a reversible switching behavior of a phase-change element made of a phase-change material, such as chalcogenide materials. At different temperatures, the phase-change material can switch between a low-resistance crystalline phase (or state) and a high-resistance amorphous phase (or state). Because the resistivity ratios of the phase-change material in the amorphous and crystalline phases are typically greater than 1,000, a PCM structure can be used a switch. A PCM structure has several operating and engineering advantages, including high speed, low power, non-volatility, high density, ready process integration, and low cost.

The programming of a phase-change material is based on the difference between the resistivity of the material in its amorphous and crystalline phases. The phase-change material is stable at certain temperature ranges in both crystalline and amorphous phases and can be switched back-and-forth between the two phases by heat excitations. In some structures, a heating element, such as a resistive heating element, is used to heat up the phase-change material to switch between the two phases. To switch between the two phases, an increase of the temperature is required. Very high temperatures with rapid cooling down will result in an amorphous phase, whereas a smaller increase in temperature or slower cooling down leads to a crystalline phase. Sensing the different resistances may be done with a small current that does not cause substantial heating.

The increase in temperature may be obtained by applying a pulse to the heating element. A high current density caused by the pulse may lead to a local temperature increase. Depending on the duration and amplitude of the pulse, the resulting phase will be different. Larger pulse amplitudes with shorter duration, so-called RESET pulses, may amorphize the cells, while smaller pulse amplitudes with longer duration will set the cell to its crystalline phase, which are so-called SET pulses.

Rapid cooling or quenching is important for resetting a phase-change material to amorphous phase, as slow cooling leads to a crystalline phase instead. However, temperature may not distribute evenly along a heating element. For example, a center portion of the heating element may have a temperature higher than its terminal portions (or end portions), or vice versa (relying on circuit structures). A portion of the phase-change material overlapping with a high temperature portion of the heating element would consequently be heated to a higher temperature and usually take a longer time to quench. The longer time to quench in turn may fail the portion of the phase-change material to reset to an amorphous phase. This quenching issue may cause a phase-change material to settle in a state having portions in a crystalline phase mixed with other portions in an amorphous phase, which compromises switching behavior and deteriorates circuit performance.

The present disclosure provides a PCM structure in which a phase-change element includes individual segments of different sizes, thicknesses, volumes, and/or spacings. The segments of the phase-change element are distributed along a heating element and fine tune the temperature gradient on the heating element to achieve a generally even distribution. Accordingly, the segments of the phase-change element may quench at about the same rate and mitigate the quenching issue caused by an otherwise un-even temperature distribution along the heating element.

The various aspects of the present disclosure will now be described in more detail with reference to the figures. FIG. 1 is a flowchart of a method 100 for fabricating a semiconductor device according to various aspects of the present disclosure. The method 100 is merely an example and not intended to limit the present disclosure to what is explicitly illustrated in the method 100. Additional steps can be provided before, during, and after the method 100, and some of the steps described can be moved, replaced, or eliminated for additional embodiments. Not all steps are described herein in detail for reasons of simplicity. The method 100 will be described below in conjunction with cross-sectional views and top views of a workpiece 200 shown in FIGS. 2-24. Because a PCM structure will be formed from the workpiece 200, the workpiece 200 may be referred to as a PCM structure 200 as the context requires. Additionally, throughout the present disclosure, like reference numerals denote like features, unless otherwise described.

Figure 2:
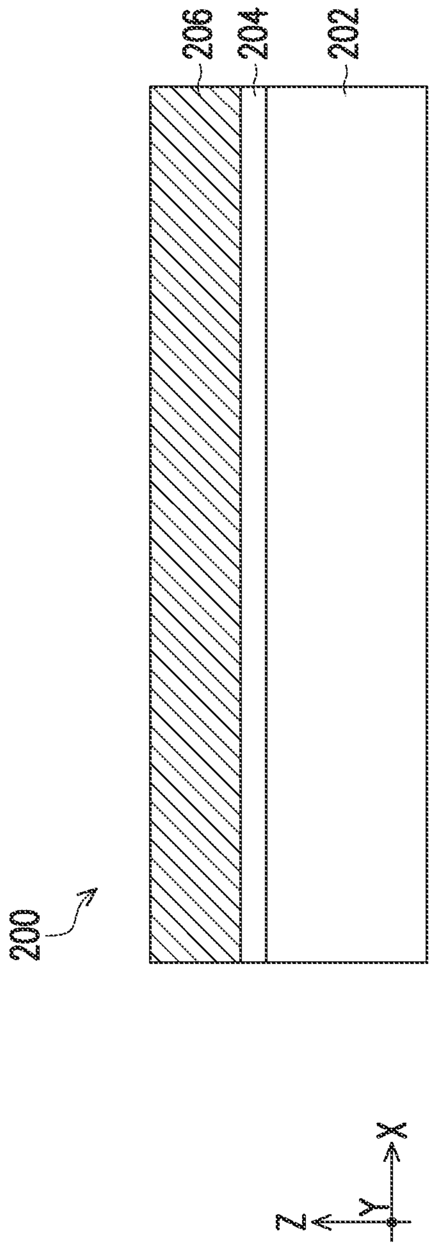
FIGS. 2, 3, 4, 5, 6, 7, 9, 10, 11, 13, 14A, 14B, and 14C illustrate cross-sectional views of a workpiece undergoing various operations of the method 100 in FIG. 1, according to various embodiments of the present disclosure.

Referring to FIGS. 1 and 2, the method 100 includes a block 102 where a metal layer 206 is deposited over an etch stop layer (ESL) 204 that includes a dielectric material. The ESL 204 may include silicon nitride, silicon oxycarbide, or silicon carbide. In the depicted embodiments, the ESL 204 is disposed over an intermetal dielectric (IMD) layer 202. The IMD layer 202 may include silicon oxide. In some embodiments, the IMD layer 202 may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, or a combination thereof. In at least some embodiments, the PCM structure fabricated using the method 100 is disposed within an interconnect structure, which is considered a back-end-of-line (BEOL) structure. In these embodiments, the PCM structure may be used as a solid-state switch to switch among different communication frequencies. As an example, the PCM structure may be used to switch among different fifth-generation (5G) frequencies. Such an interconnect structure may include eight (8) to nineteen (19) metal layers. Each of the metal layer includes a plurality of vertically extending contact vias and horizontally extending metal lines. The contact vias and metal lines for each metal layer are embedded in an ESL similar to the ESL 204 and an IMD layer similar to the IMD layer 202. The ESL 204 and the IMD layer 202 may be formed over a semiconductor wafer. The ESL 204, the IMD layer 202, and/or the semiconductor wafer may be regarded as a substrate.

The metal layer 206 may include tantalum (Ta), titanium (Ti), hafnium (Hf), ruthenium (Ru), platinum (Pt), iridium (Ir), molybdenum (Mo), tungsten (W), a combination thereof, or a nitride compound thereof. In one embodiment, the metal layer 206 is formed of tungsten (W). In this embodiment, tungsten has a low resistance to reduce energy consumption. The metal layer 206 may be deposited over the ESL 204 using chemical vapor deposition (CVD), physical vapor deposition (PVD), or other suitable technique. Subsequently, the metal layer 206 would be patterned into a heating element.

Figure 3:
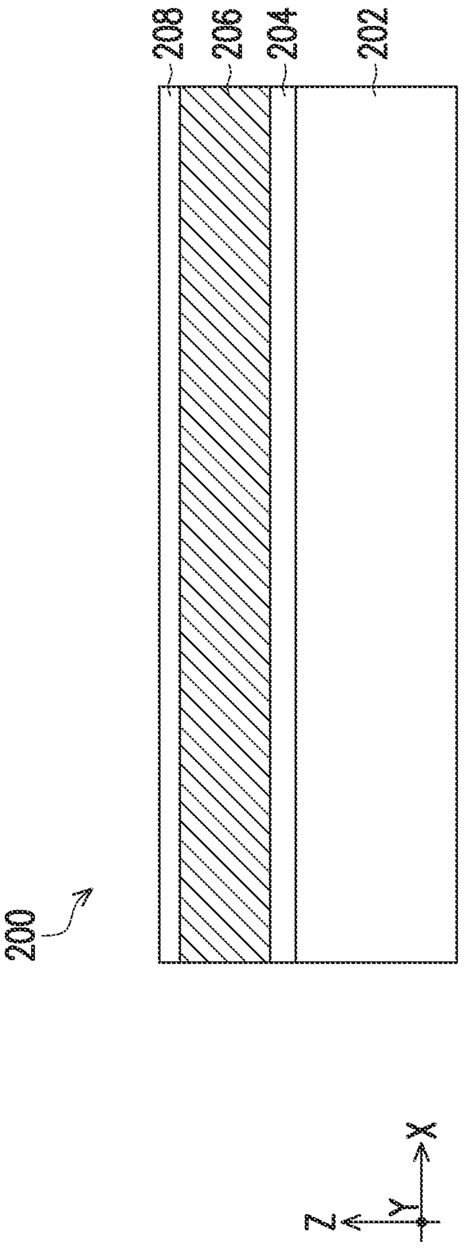

Referring to FIGS. 1 and 3, the method 100 includes a block 104 where an insulator layer 208 is deposited over the metal layer 206. In some embodiments, the insulator layer 208 includes silicon nitride, silicon oxycarbide, or silicon carbide. The insulator layer 208 may be deposited using CVD, PVD, or other suitable technique. The insulator layer 208 serves multiple purposes. In one aspect, the insulator layer 208 serves as a thermal barrier to prevent abrupt heating profile that may damage the phase-change properties of the to-be-formed phase-change element. For example, if the heating element is in direct contact with the phase-change element, heat generated by the heating element may permanently transform a portion of the phase-change element to a crystalline phase. In another aspect, the insulator layer 208 serves a protective layer to prevent damages done to the heating element during subsequent etching processes. In this aspect, the insulator layer 208 cannot be too thick or it will prevent the heating element from efficiently heating up the phase-change material layer. Based on these considerations, the insulator layer 208 may have a thickness between about 300 Å and about 1500 Å. The insulator layer 208 may not perform both functions well when it is thinner than 300 Å or thicker than 1500 Å.

Figure 4:
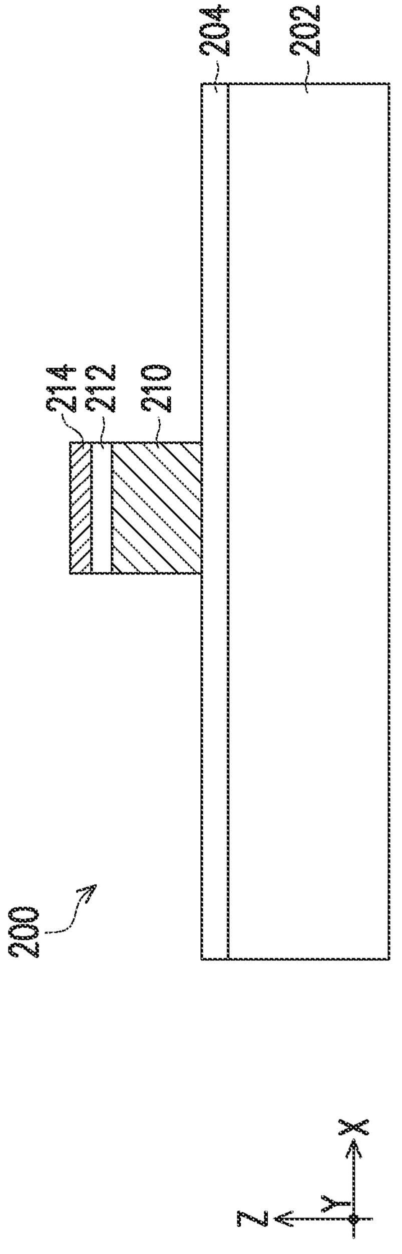

Referring to FIGS. 1 and 4, the method 100 includes a block 106 where the metal layer 206 and the insulator layer 208 are patterned to form a heating element 210 and an insulator 212, respectively. In some embodiments, the patterning at the block 106 includes lithography and etching processes. In an example process, a mask layer 214 is deposited over the insulator layer 208. The mask layer 214 may include a photoresist. The mask layer 214 is then patterned using photolithography techniques to form a patterned mask layer 214. The patterned mask layer 214 is then applied as an etch mask to etch the insulator layer 208 to form the insulator 212 and etch the metal layer 206 to form the heating element 210. A suitable etch process may be an anisotropic dry etch process that uses an inert gas (e.g., Ar, He), a fluorine-containing gas (e.g., $SF_6$, $CHF_3$), a chlorine-containing gas (e.g., $Cl_2$, $BCl_3$), nitrogen ($N_2$), oxygen ($O_2$), other suitable gases and/or plasmas, and/or combinations thereof. When viewed along the Y direction, the heating element 210 is disposed directly under the insulator 212. The mask layer 214 is subsequently removed, such as in an etching process or an ashing process.

Figure 5:
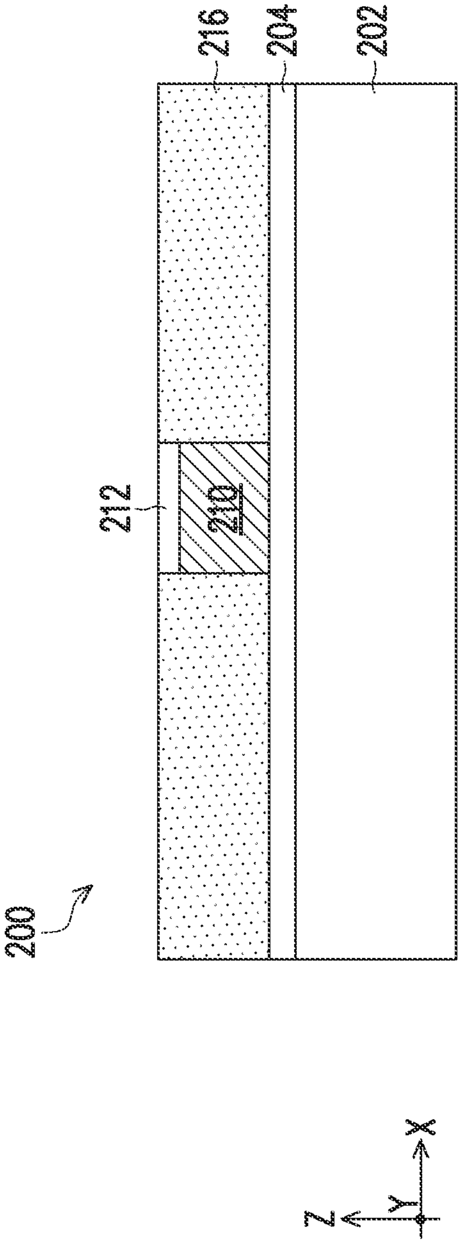

Referring to FIGS. 1 and 5, the method 100 includes a block 108 where a dielectric layer 216 is deposited on the ESL 204 and sidewalls of the heating element 210 and the insulator 212. In some embodiments, the dielectric layer 216 may include silicon oxide. In some embodiments, the dielectric layer 216 may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, or a combination thereof. In some embodiments, the dielectric layer 216 has a composition similar to that of the IMD layer 202. The dielectric layer 216 may be deposited using flowable chemical vapor deposition (FCVD), CVD, or spin-on coating. After the dielectric layer 216 is deposited, the dielectric layer 216 is planarized to expose the top surface of the insulator 212. In other words, the planarization is performed until top surfaces of the dielectric layer 216 and the insulator 212 are coplanar, as shown in FIG. 5. The planarization at the block 108 may include a chemical mechanical polishing (CMP) process.

Figure 6:
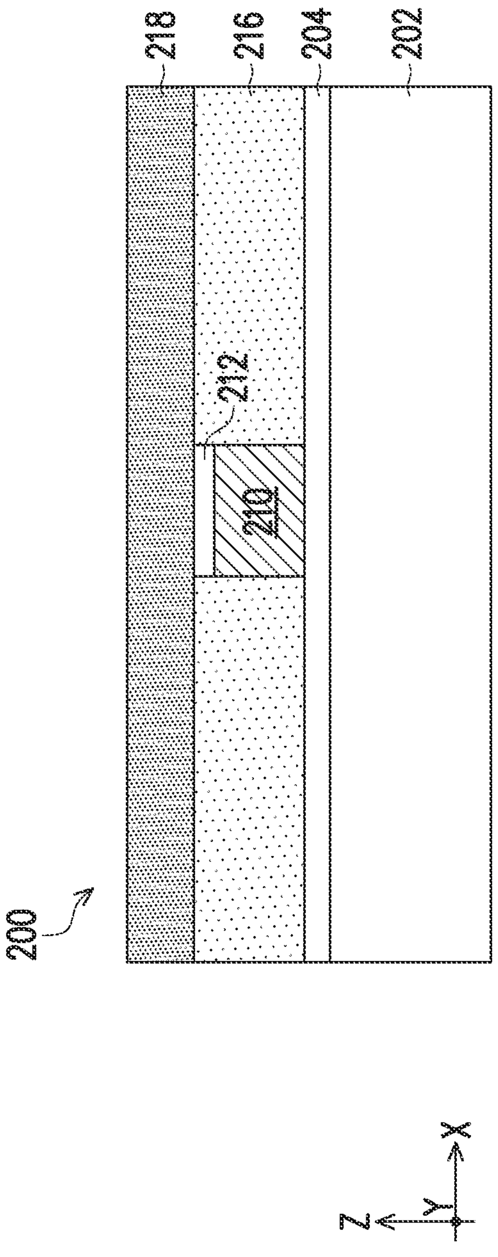

Referring to FIGS. 1 and 6, the method 100 includes a block 110 where a phase-change material layer 218 is deposited over the dielectric layer 216 and the insulator 212. In some embodiments, the phase-change material layer 218 may include chalcogenide materials. Generally, chalcogenide materials refer to chemical compounds that include at least one chalcogen ion from column VI of the periodic table. Chalcogenide materials may include sulphides, selenides, and tellurides. In some embodiments, the phase-change material layer 218 includes germanium (Ge), Tellurium (Te), and Antimony (Sb). In some instances, the phase-change material layer 218 includes germanium antimony tellurium (GeSbTe), silver indium antimony tellurium (AgInSbTe), or germanium tellurium (GeTe). To improve its performance, the phase-change material layer 218 may also be doped with various dopants, such as silicon (Si) or nitrogen (N). The phase-change material layer 218 may be deposited using CVD. PVD, or other suitable technique. In some implementations, the phase-change material layer 218 may be deposited using co-sputtering from multiple targets or sputtering from a composite target. In some instances, the composite target may have a composition similar to that of the phase-change material layer 218.

Figure 7:
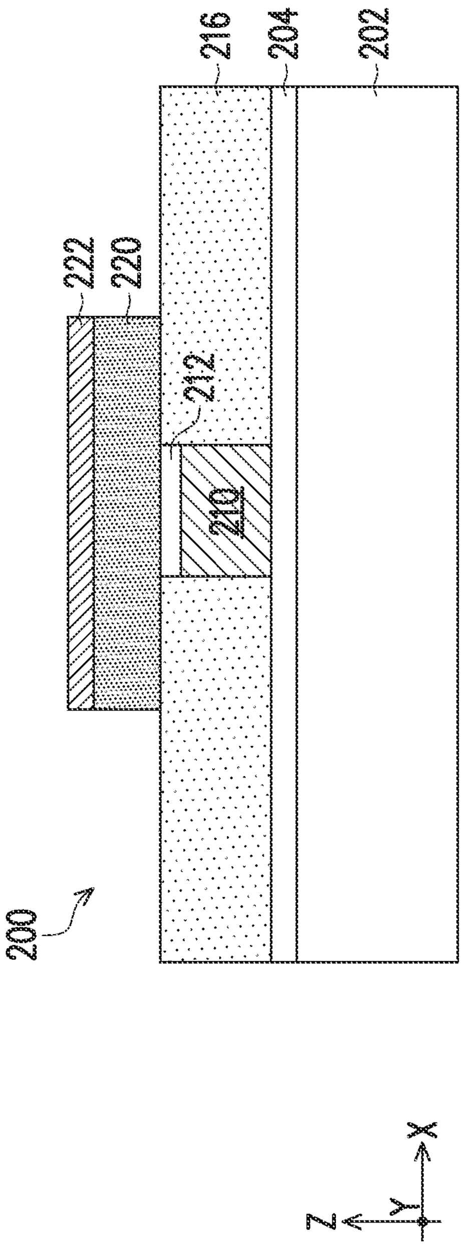

Referring to FIGS. 1 and 7, the method 100 includes a block 112 where the phase-change material layer 218 is patterned to form a phase-change element 220. In an example process, a mask layer 222 is patterned to serve as an etch mask. The mask layer 222 may include a photoresist. The mask layer 222 is then patterned using photolithography techniques to form a patterned mask layer 222. The patterned mask layer 222 is then applied as an etch mask to etch the phase-change material layer 218 to form the phase-change element 220. As shown in FIG. 7, the phase-change material layer 218 is patterned such that the phase-change element 220 extends over or spans over the insulator 212 and the heating element 210. In other words, along the vertical direction (i.e., Z direction), the phase-change element 220 overlaps with the insulator 212 and the heating element 210. The phase-change element 220 is in direct contact with the insulator 212. The mask layer 222 is subsequently removed, such as in an etching process or an ashing process.

Figure 8:
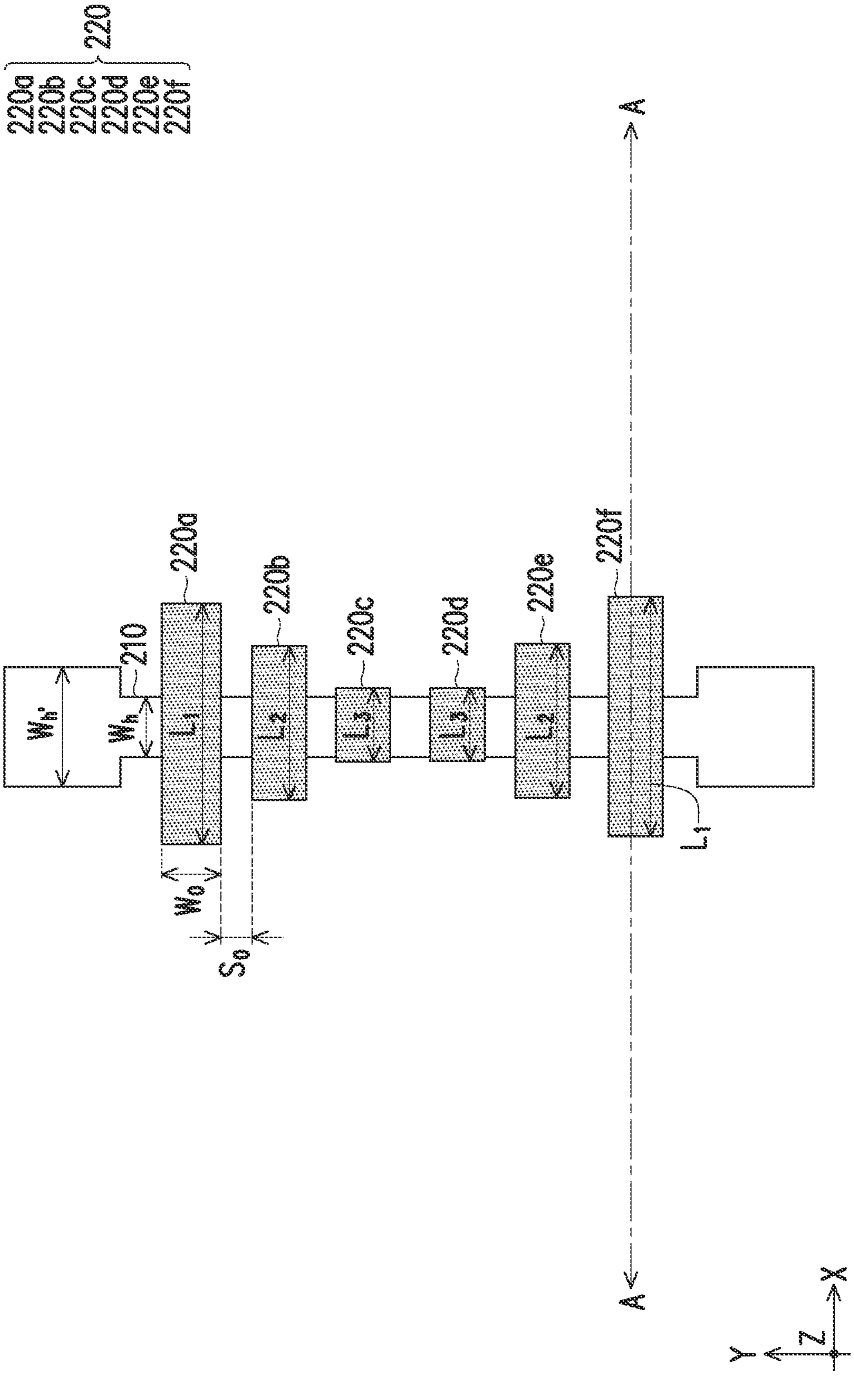
FIGS. 8, 12, 15, 16, 17, 18, 19, 20, 21, 22, 23, and 24 illustrate top views of the PCM structure undergoing various operations of the method 100 in FIG. 1, according to various embodiments of the present disclosure.

Reference is now made to FIG. 8, which is a top view of the PCM structure 200 shown in FIG. 7. In fact, the cross-sectional view shown in FIG. 7 depicts structures along line A-A shown in FIG. 8. It is noted that, for simplicity of illustration, FIG. 8 does not include illustration of every single layer. For example, illustrations of the mask layer 222, the insulator 212, the dielectric layer 216, the ESL 204, and the IMD layer 202 are omitted from FIG. 8. In some embodiments represented in FIG. 8, the heating element 210 extends lengthwise along the Y direction. The heating element 210 has a dumbbell shape with two via pads on the sides and sandwiching a middle portion with a substantially uniform width $W_h$. The via pads have an expanded width $W_h'$ that is larger than $W_h$. During operation, a current is conducted into the heating element 210 through vias landing on the via pads to heat up the heating element 210. The via pads may have a square shape, a rectangular shape, a circular shape, an oval shape, or other suitable shape.

The phase-change material layer 218 is patterned into multiple segments that collectively define the phase-change element 220. In other words, the phase-change element 220 includes multiple discrete segments. The segments of the phase-change element 220 are disposed along the Y direction with each of the segments overlapping with a portion of the heating element 210. In the depicted embodiment in FIG. 8, the phase-change element 220 includes six (6) segments 220*a*-220*f* with a substantial uniform width $W_0$ and a substantially uniform spacing $S_0$ between adjacent two of the segments 220*a*-220*f*, which is for illustrative purposes only and not intended to be limiting beyond what is specifically recited in the claims. It can be appreciated that any number of segments in the phase-change element 220 with different widths and/or different spacings can be formed depending on design needs. The segments 220*a*-220*f* each generally extend lengthwise along the X-direction but with different lengths. Particularly, in the depicted embodiment in FIG. 8, the segments 220*d*-220*f* are mirroring the segments 220*a*-220*c* with respect to a line along the X-direction through a center point of the phase-change element 220. The segments 220*a* and 220*f* on edges of the phase-change element 220 have the longest length $L_1$, the segments 220*c* and 220*d* in center of the phase-change element 220 have the shortest length $L_3$, and the other segments 220*b* and 220*e* of the phase-change element 220 have a medium length $L_2$ (i.e., $L_1>L_2>L_3>W_0$). In the depicted embodiment, the shortest length L3 is larger than the width $W_h$ of the heating-element 210 to ensure overlapping along the X direction between the segments and the heating element 210 to efficiently utilize heat generated from the heating-element 210. The reason to pattern the phase-change element 220 into segments of different sizes will be further explained in detail with reference to FIG. 15.

Figure 9:
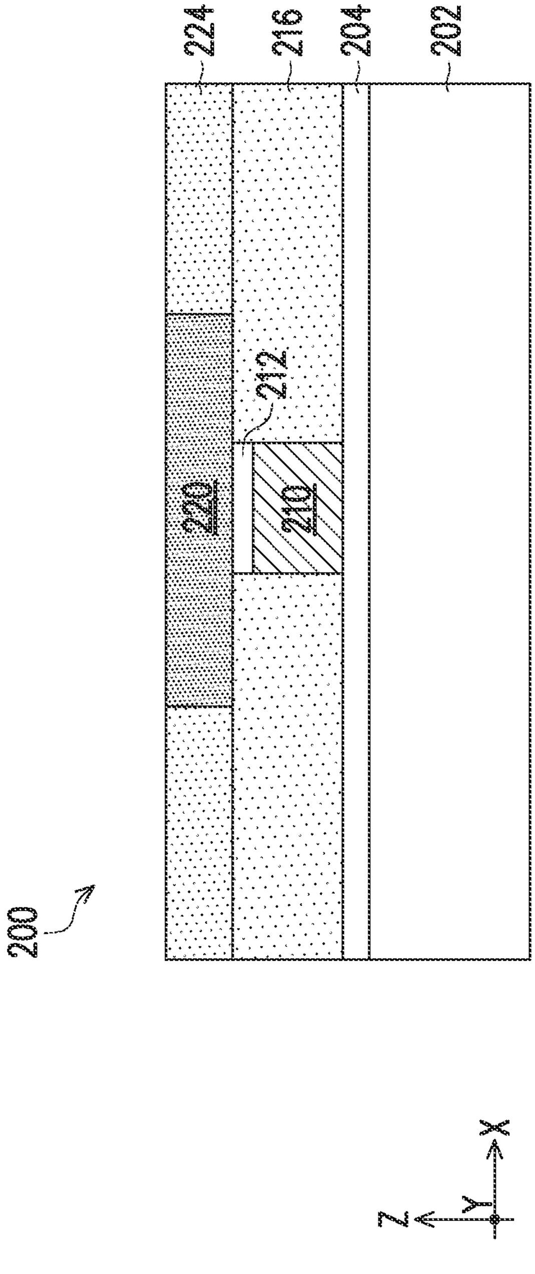

Referring to FIGS. 1 and 9, the method 100 includes a block 114 where a dielectric layer 224 is deposited on the dielectric layer 216 and sidewalls of the phase-change element 220. In some embodiments, the dielectric layer 224 may include silicon oxide. In some embodiments, the dielectric layer 224 may include a porous organosilicate thin film such as SiOCH, tetraethylorthosilicate (TEOS) oxide, undoped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, or a combination thereof. In some embodiments, the dielectric layer 224 has a composition similar to that of the dielectric layer 216. In some embodiments, the dielectric layer 224 has a composition different from that of the dielectric layer 216. The dielectric layer 224 may be deposited using flowable chemical vapor deposition (FCVD), CVD, or spin-on coating. After the dielectric layer 224 is deposited, the dielectric layer 224 is planarized to expose the top surface of the phase-change element 220. In other words, the planarization is performed until top surfaces of the dielectric layer 224 and phase-change element 220 are coplanar, as shown in FIG. 9. The planarization at block 114 may include a CMP process.

Figure 10:
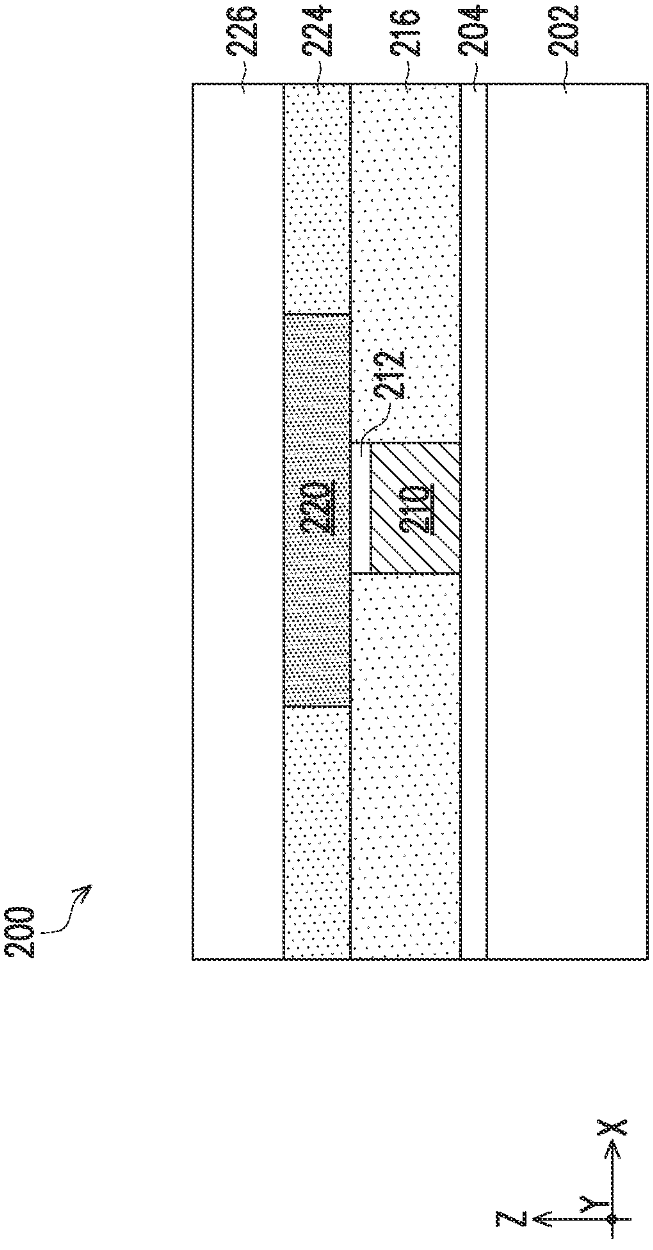

Referring to FIGS. 1 and 10, the method 100 includes a block 116 where a metal layer 226 is deposited over the dielectric layer 224 and the phase-change element 220. The metal layer 226 may include tantalum (Ta), titanium (Ti), hafnium (Hf), ruthenium (Ru), platinum (Pt), iridium (Ir), molybdenum (Mo), tungsten (W), a combination thereof, or a nitride compound thereof. The metal layer 226 may be deposited using CVD, PVD, or other suitable method. In one embodiment, the metal layer 226 is formed of tungsten (W).

Figure 11:
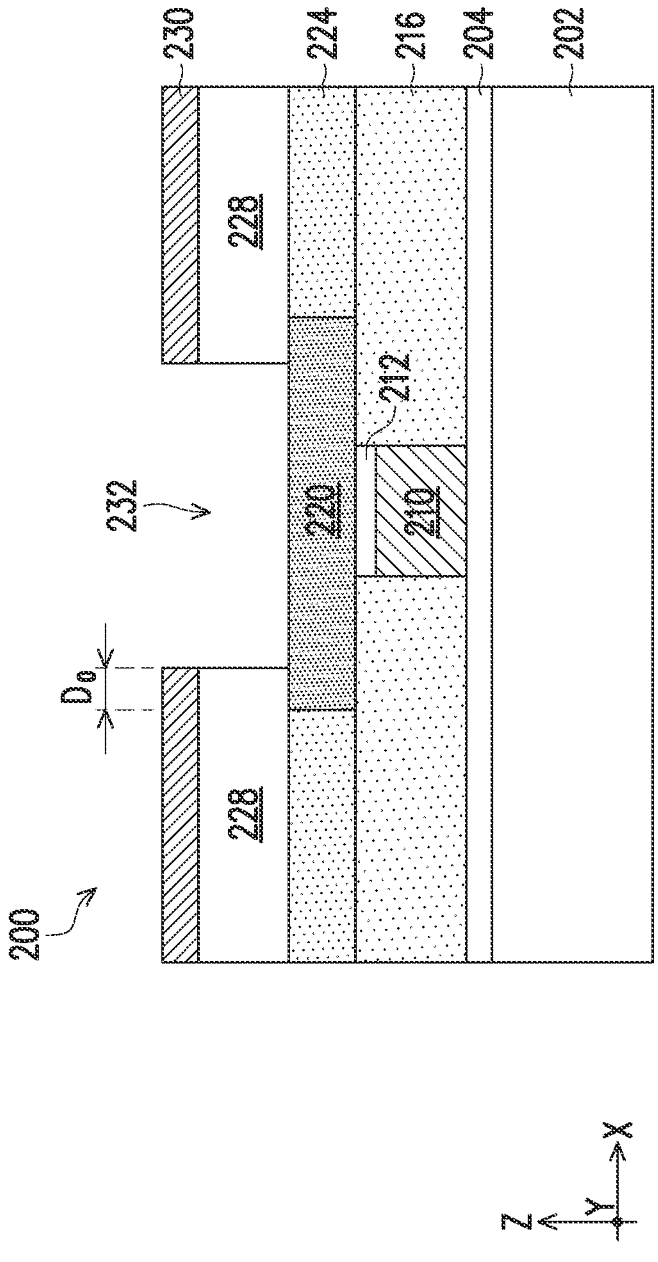

Referring to FIGS. 1 and 11, the method 100 includes a block 118 where the metal layer 226 is patterned into electrodes 228. In some embodiments, the patterning includes lithography and etching processes. In an example process, a mask layer 230 is deposited over the metal layer 226. The mask layer 230 may include a photoresist. The mask layer 230 is then patterned using photolithography techniques to form a patterned mask layer 230 that includes an opening 232. The patterned mask layer 230 is then applied as an etch mask to etch the metal layer 226 to form the electrodes 228 that are spaced apart from one another along the X direction. A suitable etch process may be an anisotropic dry etch process that uses an inert gas (e.g., Ar, He), a fluorine-containing gas (e.g., $SF_6$, $CHF_3$), a chlorine-containing gas (e.g., $Cl_2$, $BCl_3$), nitrogen ($N_2$), oxygen ($O_2$), other suitable gases and/or plasmas, and/or combinations thereof. As shown in FIG. 11, the metal layer 226 is patterned such that the electrodes 228 extends over or spans over edges of the phase-change element 220 for a distance $D_0$. In other words, along the vertical direction (i.e., Z direction), each of the electrodes 228 overlaps with the phase-change element 220. The phase-change element 220 is in direct contact with the electrodes 228. As the electrodes 228 of the present disclosure are sufficiently electrically conductive for radio frequency (RF) applications, they may also be referred to as the RF electrodes 228. The mask layer 230 is subsequently removed, such as in an etching process or an ashing process.

Figure 12:
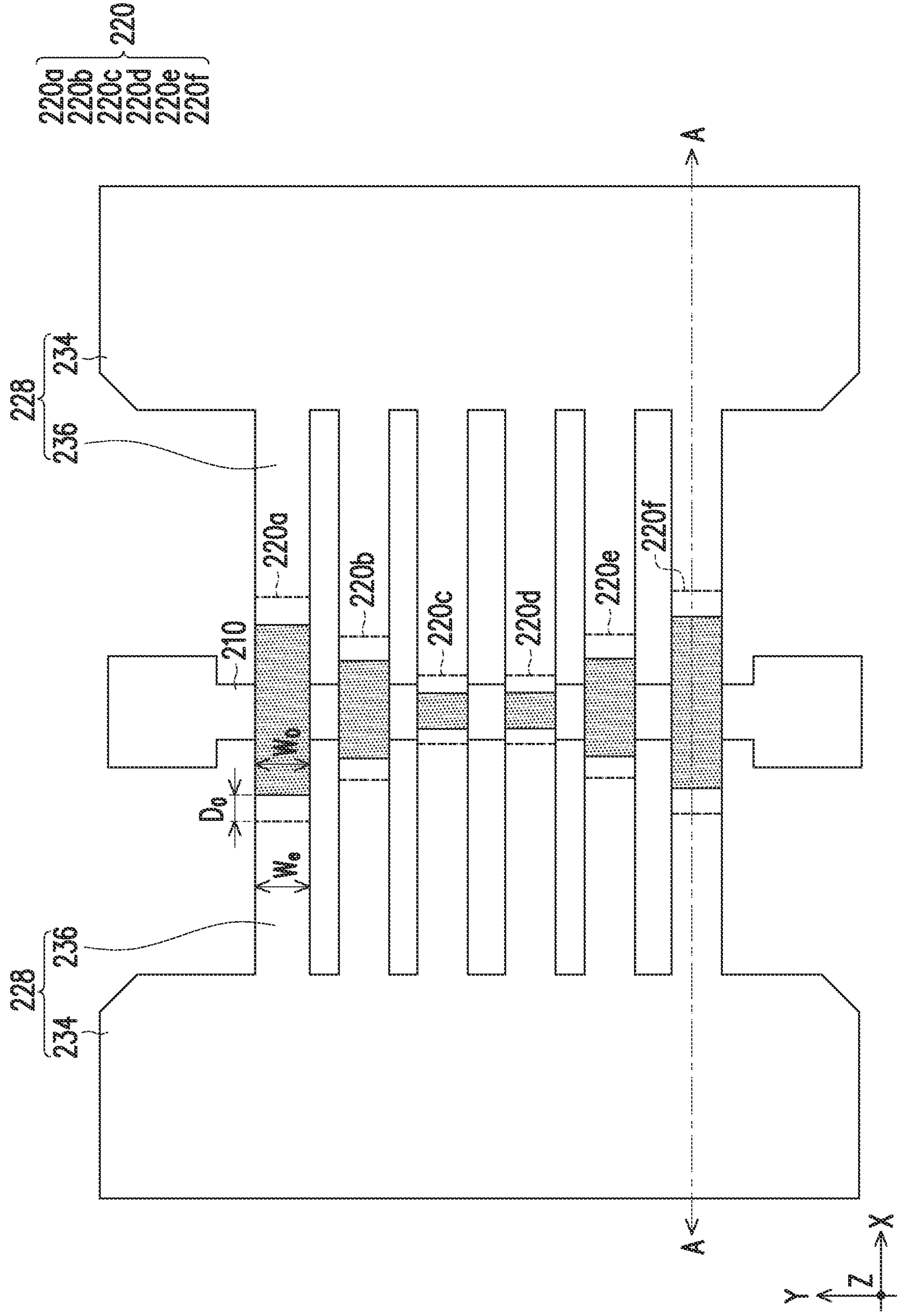

Reference is now made to FIG. 12, which is a top view of the PCM structure 200 shown in FIG. 11. In fact, the cross-sectional view shown in FIG. 11 depicts structures along line A-A shown in FIG. 12. It is noted that, for simplicity of illustration, FIG. 12 does not include illustration of every single layer. For example, illustrations of the mask layer 230, the dielectric layer 224, the insulator 212, the dielectric layer 216, the ESL 204, and the IMD layer 202 are omitted from FIG. 12. In some embodiments represented in FIG. 12, each of the electrodes 228 includes a common portion 234 and multiple extending arms 236 extending lengthwise along the X direction from the common portion 234. The number of the extending arms 236 equal the number of segments of the phase-change element 220. In other words, each of the segments of the phase-change element 220 has one edge in direct contact with a corresponding arm 236 of one of the electrodes 228 and another edge in direct contact with a corresponding arm 236 of another one of the electrodes 228. Since opposing edge portions of the segments of the phase-change element 220 are covered by the extending arms 236 of the electrodes 228, boxes with dashed lines are overlaying with the segments in FIG. 12 to illustrated contours of the segments. Each extending arm 236 has a width $W_e$ measured along the Y direction. The width $W_e$ of an extending arm 236 may equal the width $W_0$ of the corresponding segment in some embodiments. Alternatively, the width $W_e$ of an extending arm 236 may be larger than the width $W_0$ of the corresponding segment to ensure a good electrical contact therebetween. Alternatively, the width $W_e$ of an extending arm 236 may be smaller than the width $W_0$ of the corresponding segment to enlarge gaps between adjacent two of the extending arms 236 in order to reduce parasitic capacitance between the extending arms 236. The extending arms 236 may overlap with the corresponding segments for a substantially uniform distance $D_0$. Depending on the length of a segment, an edge of the corresponding extending arm 236 may be distant from the edges of the heating element 210 or overlapping with the heating element 210. In the depicted embodiment in FIG. 12, the extending arms 236 in direct contact with the segments 220*a*, 220*b*, 220*c*, and 220*f* have edges distant from the edges of the heating element 210, while the extending arms 236 in direct contact with the segments 220*c* and 220*d* have edges above the heating element 210 in the Z direction. In other words, some of the extending arms 236 may overlap with the heating element 210 in a top view. In some alternative embodiments, edges of all the extending arms 236 are distant from the heating element 210 along the X direction to avoid creating overlapping regions that may otherwise introduce extra parasitic capacitance.

Figure 13:
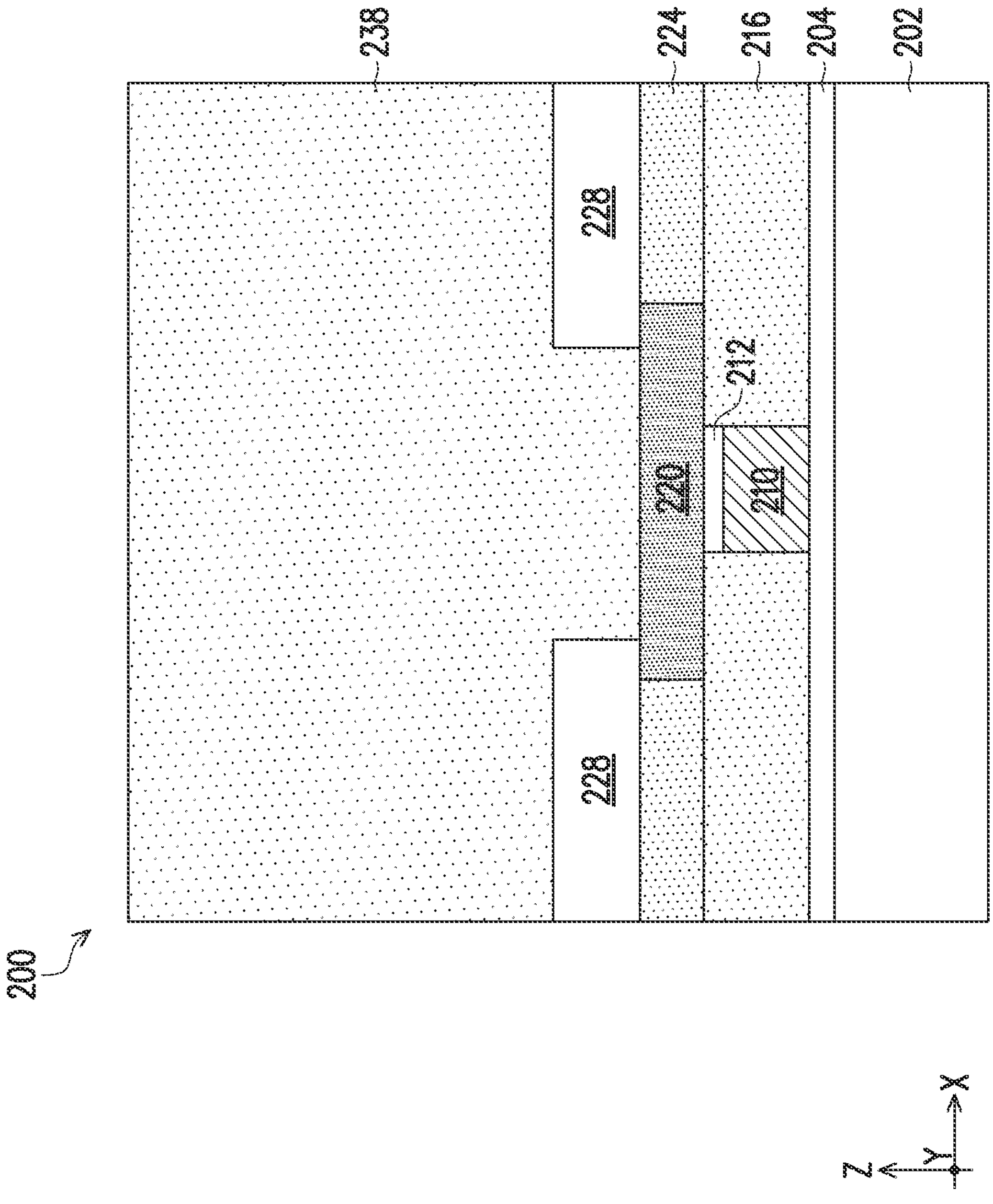

Referring to FIGS. 1 and 13, the method 100 includes a block 120 where a dielectric layer 238 is deposited over the electrodes 228 and the phase-change element 220. In some embodiments, the dielectric layer 238 may include silicon oxide. In some embodiments, the dielectric layer 238 may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, or a combination thereof. In at least some embodiments of the present disclosure, the dielectric layers 216, 224, 238 may have the same composition, such as silicon oxide. Alternatively, the dielectric layers 216, 224, 238 may have compositions different from one another.

Figure 14A:
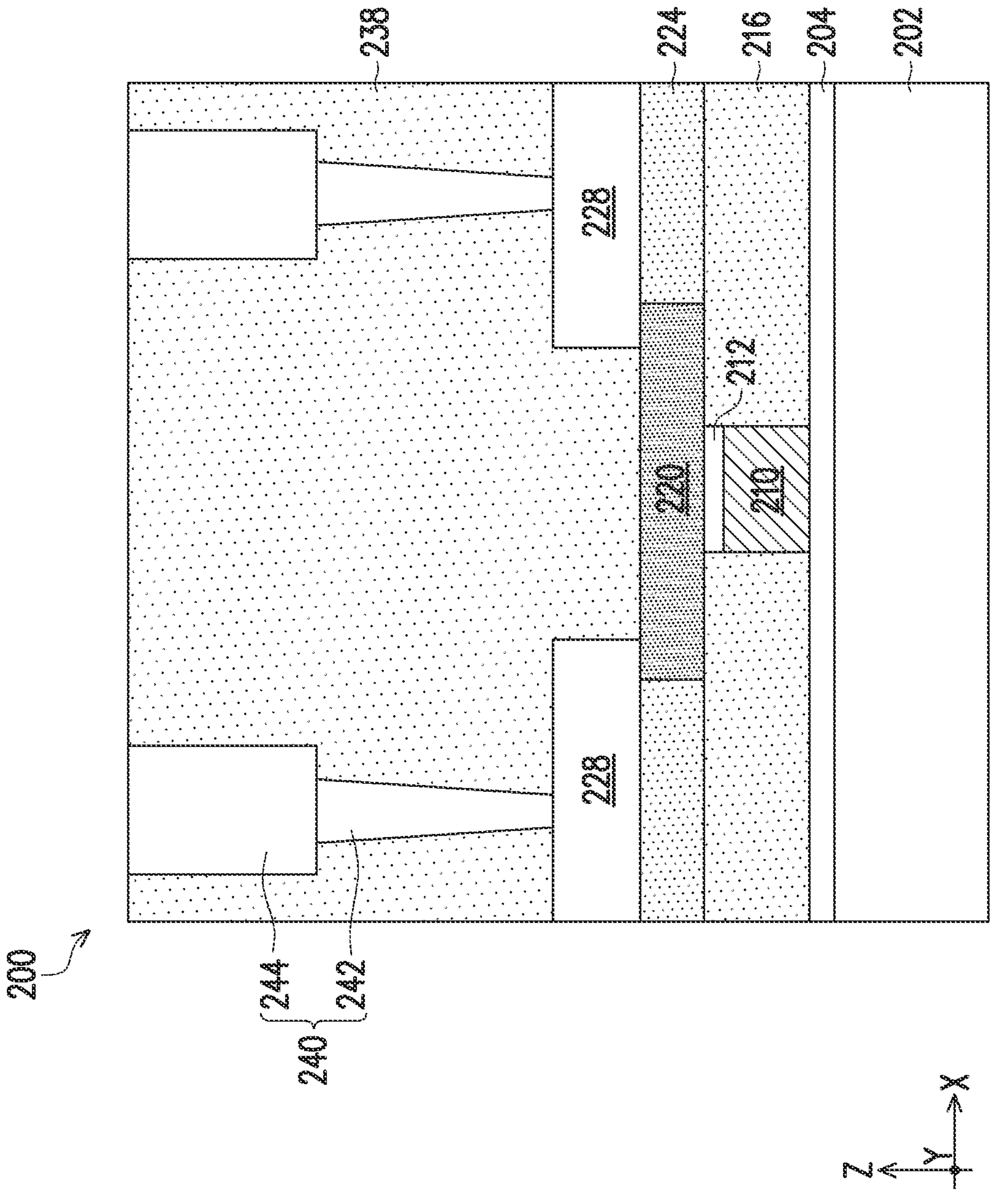

Referring to FIGS. 1 and 14A, the method 100 includes a block 122 where contact structures 240 are formed to couple to the electrodes 228. Not explicitly shown in FIG. 14A (but in FIG. 15), the contact structures 240 are also formed to couple to the two via pads of the heating element 210. In the depicted embodiment, each of the contact structures 240 includes a via 242 and a metal line 244 disposed on the via 242. The via 242 and the metal line 244 may include aluminum (Al), copper (Cu), cobalt (Co), or nickel (Ni). In one embodiment, they all include copper (Cu). In an example process, the contact structures 240 are formed using a dual damascene process. While not explicitly shown, the contact structures 240 may include a barrier layer to interface the dielectric layer 238. The barrier layer may include titanium nitride or tantalum nitride and function to reduce electromigration.

Figure 14B:
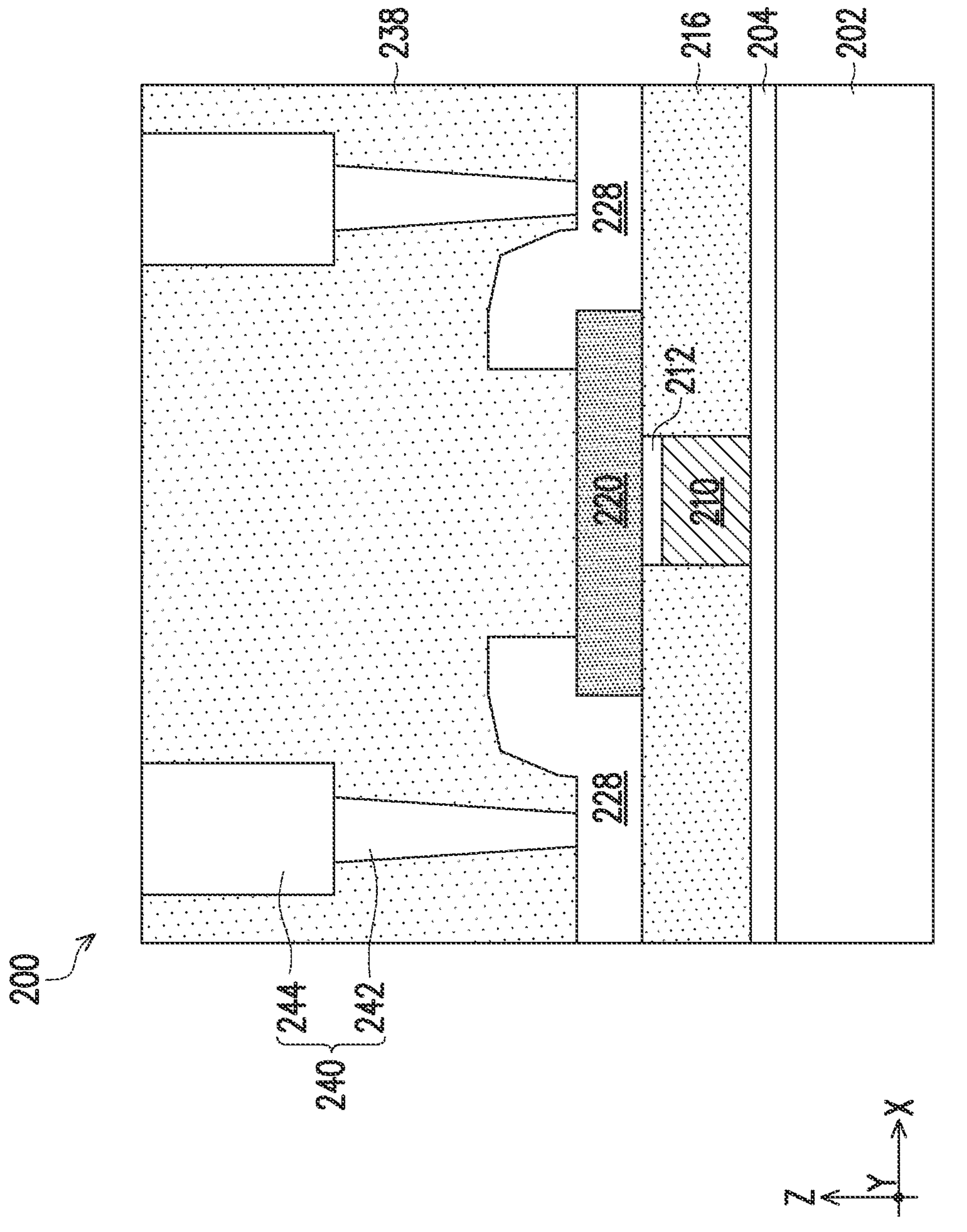

FIG. 14B illustrates an alternative embodiment at the conclusion of the block 122. One difference between the embodiment depicted in FIG. 14B and the one in FIG. 14A is that after the formation of the phase-change element 220, the metal layer 226 is deposited as a blanket layer and patterned to form the electrodes 228, without forming the dielectric layer 224. The electrodes 228 is in direct contact with the dielectric layer 216 and sidewalls and edge portions of the phase-change element 220. The dielectric layer 238 covers the electrodes 228.

Figure 14C:
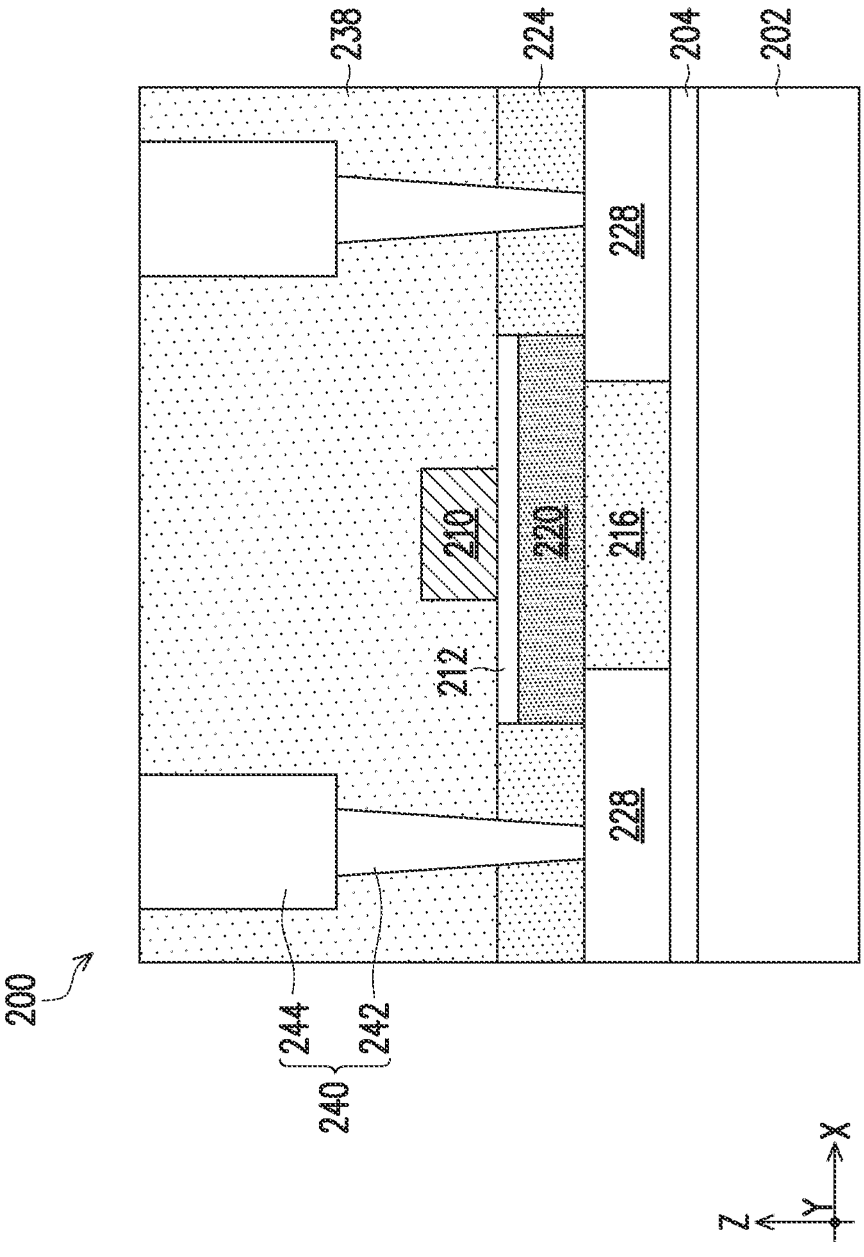

In the embodiments depicted in FIGS. 14A and 14B, the phase-change element 220 is formed above the heating element 210. FIG. 14C illustrates an alternative embodiment, in which the heating element 210 is formed above the phase-change element 220. In the alternative embodiment depicted in FIG. 14C, the electrodes 228 are first formed on the ESL 204 with the dielectric layer 216 filling the opening therebetween, and the phase-change element 220 and the insulator 212 are subsequently formed above the electrodes 228 with the dielectric layer 224 deposited on sidewalls thereof. Since the phase-change element 220 and the insulator 212 may be patterned together, the phase-change element 220 and the insulator 212 may have the same size, which is larger than that of the subsequently formed heating element 210. The heating element 210 is then deposited on the insulator 212. The dielectric layer 238 covers the heating element 210.

Figure 15:
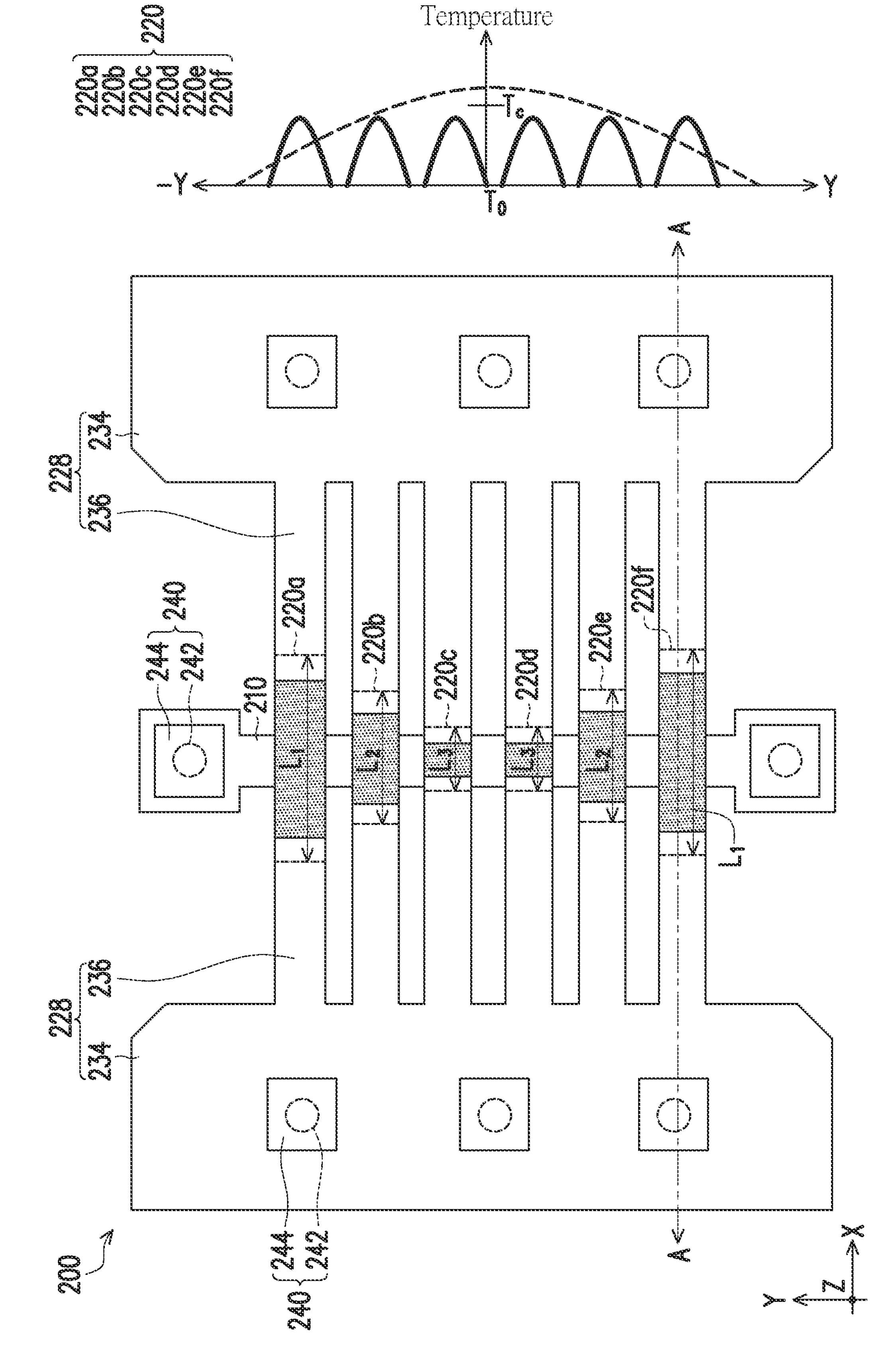

Reference is now made to FIG. 15, which is a top view of the PCM structure 200 shown in FIG. 14A. In fact, the cross-sectional view shown in FIG. 14A depicts structures along line A-A shown in FIG. 15. It is noted that, for simplicity of illustration, FIG. 15 does not include illustration of every single layer. For example, illustrations of the dielectric layer 238, the dielectric layer 224, the insulator 212, the dielectric layer 216, the ESL 204, and the IMD layer 202 are omitted from FIG. 15. It is further noted that, the top views of the PCM structure 200 corresponding to the cross-sectional views shown in alternative embodiments of FIGS. 14B and 14C are substantially similar to the one depicted in FIG. 15 but with different sequence of stacking of the electrodes 228, the phase-change element 220, and the heating element 210. Such alternative top views are omitted for the sake of conciseness and simplicity.

In some embodiments represented in FIG. 15, there are multiple contact structures 240 landing on the common portion 234 of each of the electrodes 228 in an effort to reduce contact resistance due to the relatively larger area provided by the common portion 234. An edge-to-edge span of the common portion 234 along the Y direction may be larger than an edge-to-edge span of the heating element 210 along the Y direction. In other words, the two via pads of the heating element 210 are positioned within two opposing edges of the common portion 234 along the Y direction, which helps reducing the footprint of the PCM structure 200. The smaller footprint is helpful when more PCM structures 200 are needed. Alternatively, the via pads of the heating element 210 may extend beyond opposing edges of the common portion 234 along the Y direction, which helps enlarging spacing between the contact structures 240 landing on the heating element 210 and the adjacent ones landing on the electrodes 228 as an effort to reduce parasitic capacitance therebetween. Although the footprint is larger, the reduced parasitic capacitance between the contact structures 240 helps improving high-speed performance of the circuit.

Still referring to FIG. 15, a temperature gradient map is overlaying aside the PCM structure 200. The curved dotted line illustrates the temperature gradient along the Y direction of the heating element 210 if a continuous phase-change element 220 with a uniform width is overlapping with the heating element 210. On the other hand, the ripples of solid lines illustrate the actual temperature gradient along the Y direction of the heating element 210 with the segmented phase-change element 220. The temperature gradient represented by the ripples is more uniform than the one represented by the curved dotted line.

When a current passes through the heating element 210 by way of the contact structures 240, the resistance in the heating element 210 generates joule heating to heat up the phase-change element 220. Meanwhile, the metals in the contact structures 240 as a good heat conductor also dissipate heat away from the terminal ends (i.e., the edge portions adjacent the via pads) of the heating element 210, which causes a center portion of the heating element 210 to exhibit a higher temperature than its terminal ends. To ensure the temperature at the terminal ends of the heating element 210 is high enough during a RESET pulse, the temperature of the center portion of the heating element 210 may be riskily high and exceed a reference temperature point $T_c$. Beyond Te, the heated portion of the phase-change element 220 won't be able to quench fast enough and may settle in a crystalline phase instead. Since the phase-change element 220 also functions as a heat shield covering the heating element 210, by segmenting the phase-change element 220 and having the segments located above the center portion of the heating element 210 (e.g., segments 220*c* and 220*d*) to have a smaller size (e.g., the shortest length $L_3$ as in FIG. 15), the heat accumulated at the center portion of the heating element 210 is easier to dissipate into its surrounding environment. Accordingly, the temperature at the center portion of the heating element 210 is also reduced to a point below $T_c$. On the other hand, the segments located near the terminal ends of the heating element 210 (e.g., segments 220*a* and 220*f*) have a larger size (e.g., the largest length $L_1$ as in FIG. 15), which allows heat accumulated at the terminal ends of the heating element 210 dissipates slower and maintains above a reference temperature point $T_0$ that safeguards a sufficiently high temperature to melt the phase-change material in the phase-change element 220 during a RESET pulse. Thus, the temperature gradient along the heating element 210 (and the segments of the phase-change element 220) along the Y direction becomes more evenly distributed and bounded by $T_0$ and $T_c$. In some embodiments, a ratio of the largest length $L_1$ and the shortest length $L_3$ (i.e., $L_1/L_3$) ranges from about 1.2:1 to about 5:1, depending on design needs.

Figure 16:
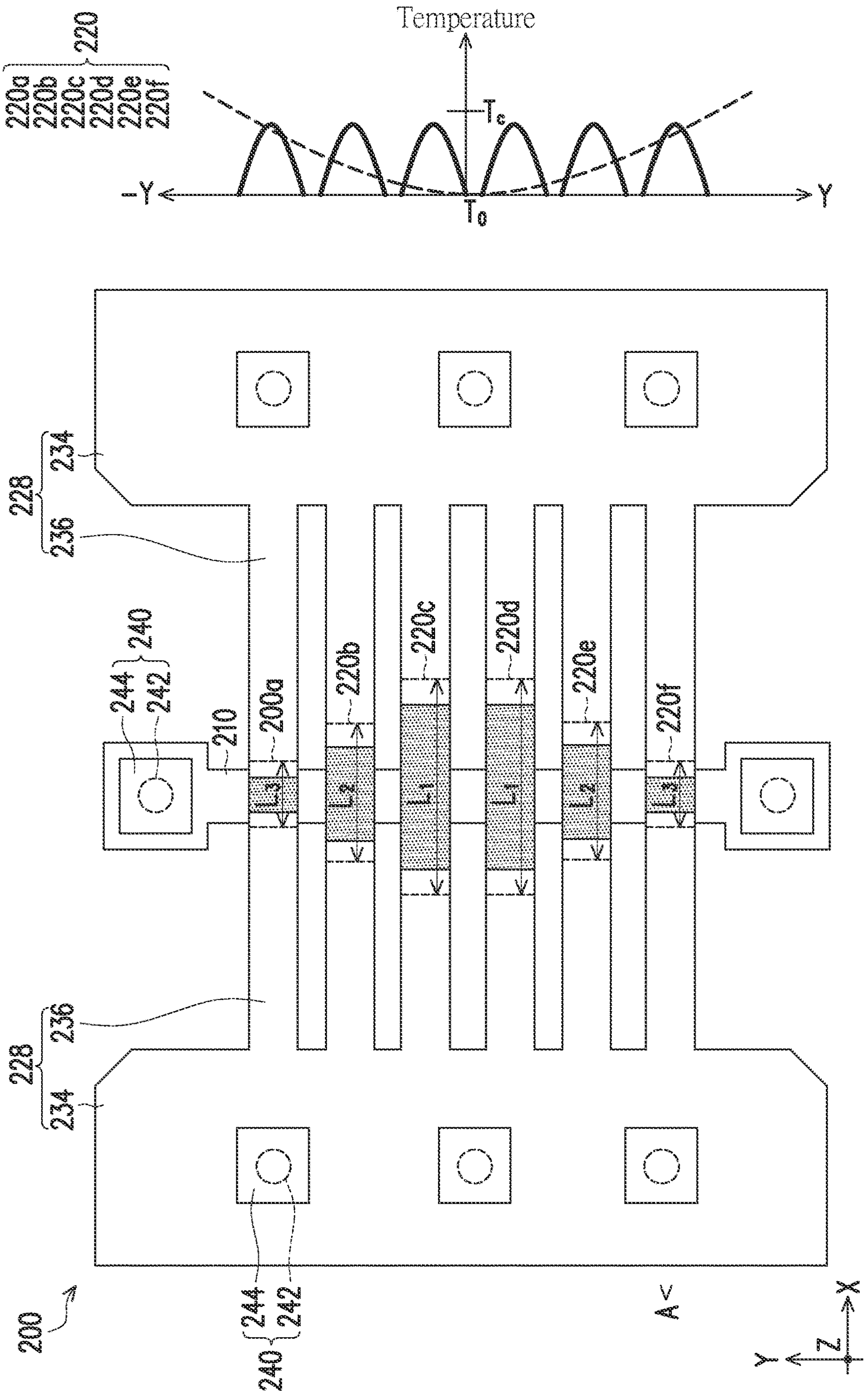

Reference is now made to FIG. 16, which is a top view of an alternative embodiment of the PCM structure 200. Features of the alternative embodiment represented in FIG. 16 are similar to those in FIG. 15. One difference is that the phase-change element 220 is segmented in a different way, such that the segments above the center portion of the heating element 210 (e.g., segments 220*c* and 220*d*) have the largest size (e.g., the largest length $L_1$ as in FIG. 16) and the segments near the terminal ends of the heating element 210 (e.g. segments 220*a* and 220*f*) have the smallest size (e.g., the shortest length $L_3$ as in FIG. 16). This arrangement is to compensate a different temperature gradient along the Y direction of the heating element 210. The curved dotted line in FIG. 16 is a flip of the one in FIG. 15, representing a higher temperature at terminal ends of the heating element 210. The reason causing such a reversed temperature gradient may be due to other chunk metal structure overlying above or under the PCM structures 200. For example, a heat sink for other functional circuits (not shown) may happen to locate above the center portion of the heating element 210 as formed in subsequent BEOL processes and absorb heat from the center portion of the heating element 210.

Still referring to FIG. 16, to ensure the temperature at the center portion of the heating element 210 is high enough during a RESET pulse, the temperature of the terminal ends of the heating element 210 may be riskily high and exceed the reference temperature point $T_c$ if a continuous phase-change element 220 with a uniform width is overlapping with the heating element 210. Since the phase-change element 220 also functions as a heat shield covering the heating element 210, by segmenting the phase-change element 220 and having the segments located above the terminal ends of the heating element 210 (e.g., segments 220*a* and 220*f*) to have a smaller size (e.g., the shortest length $L_3$ as in FIG.

16), the heat accumulated at the terminal ends of the heating element 210 is easier to dissipate into its surrounding environment. Accordingly, the temperature at the terminal ends of the heating element 210 is also reduced to a point below Te. On the other hand, the segments located above the center portion of the heating element 210 (e.g., segments 220*c* and 220*d*) have a larger size (e.g., the largest length $L_1$ as in FIG. 16), which allows heat accumulated at the center portion of the heating element 210 dissipates slower and maintains above a reference temperature point $T_0$ that safeguards a sufficiently high temperature to melt the phase-change material in the phase-change element 220 during a RESET pulse. Thus, the temperature gradient along the heating element 210 (and the segments of the phase-change element 220) along the Y direction becomes more evenly distributed and bounded by $T_0$ and $T_c$.

Figure 17:
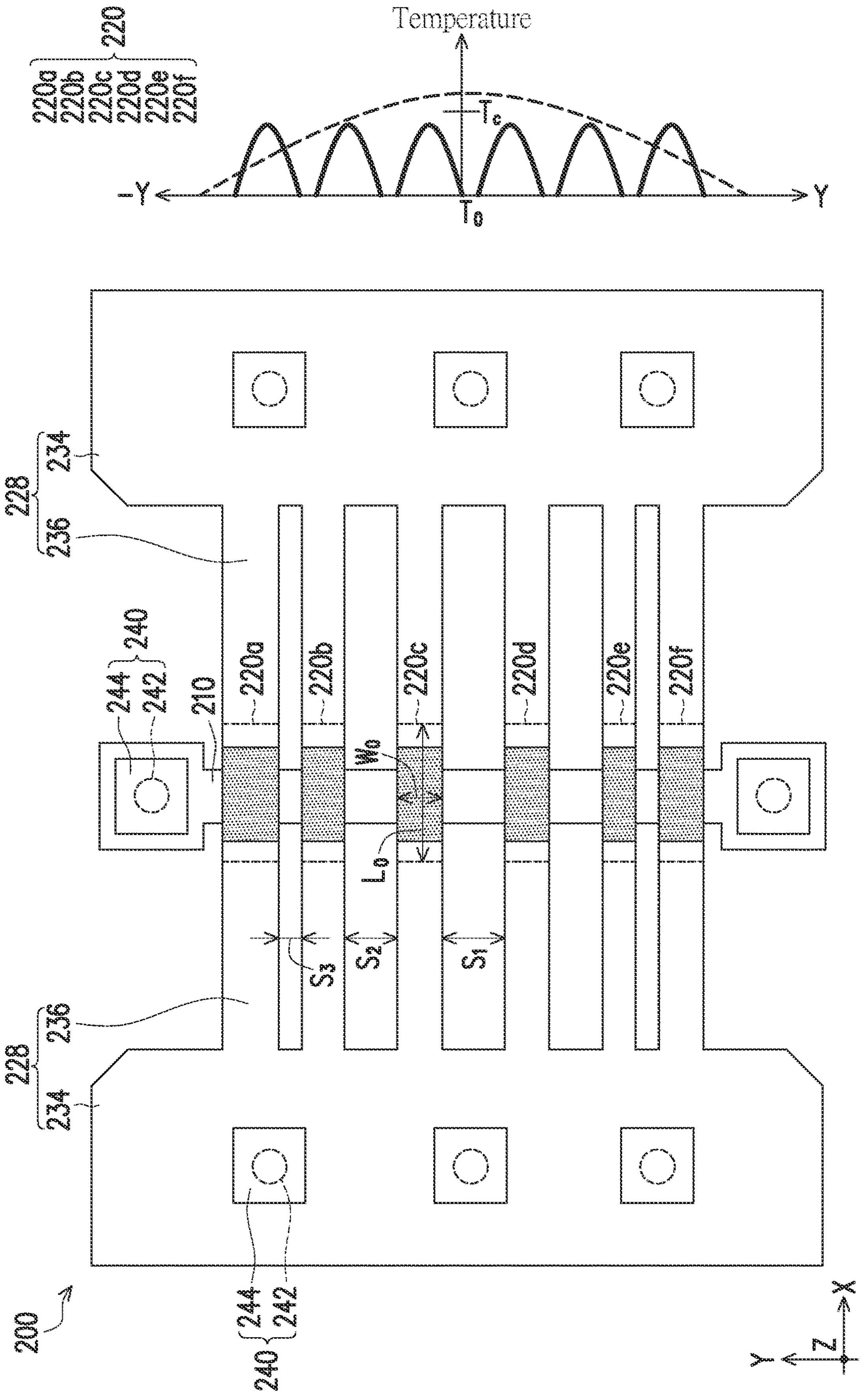

Reference is now made to FIG. 17, which is a top view of an alternative embodiment of the PCM structure 200. Features of the alternative embodiment represented in FIG. 17 are similar to those in FIG. 15, including the temperature gradient map. One difference is that the phase-change element 220 is segmented in a different way, such that the segments have the same size, such as a substantially uniform length $L_0$ and a substantially uniform width $W_0$, but with different edge-to-edge spacings (e.g., spacings $S_1$-$S_3$ as in FIG. 17). In the depicted embodiment, the segments 220*c* and 220*d* have the largest spacing $S_1$, the segments 220*a* and 220*b* (as well as segments 220*e* and 220*f*) have the smallest spacing $S_3$, and the segments 220*b* and 220*c* (as well as segments 220*d* and 220*e*) have the medium spacing $S_2$. This arrangement is to compensate a temperature gradient along the Y direction of the heating element 210 with the highest temperature at the center portion of the heating element 210. The larger spacing (e.g., spacing $S_1$) between the segments above the center portion of the heating element 210 allows heat accumulated therein to dissipate faster into its surrounding environment. With the various spacings, the temperature gradient along the heating element 210 (and the segments of the phase-change element 220) along the Y direction becomes more evenly distributed and bounded by $T_0$ and $T_c$. In some embodiments, a ratio of the largest spacing $S_1$ and the smallest spacing $S_3$ (i.e., $S_1/S_3$) ranges from about 1.2:1 to about 3:1, depending on design needs.

Figure 18:
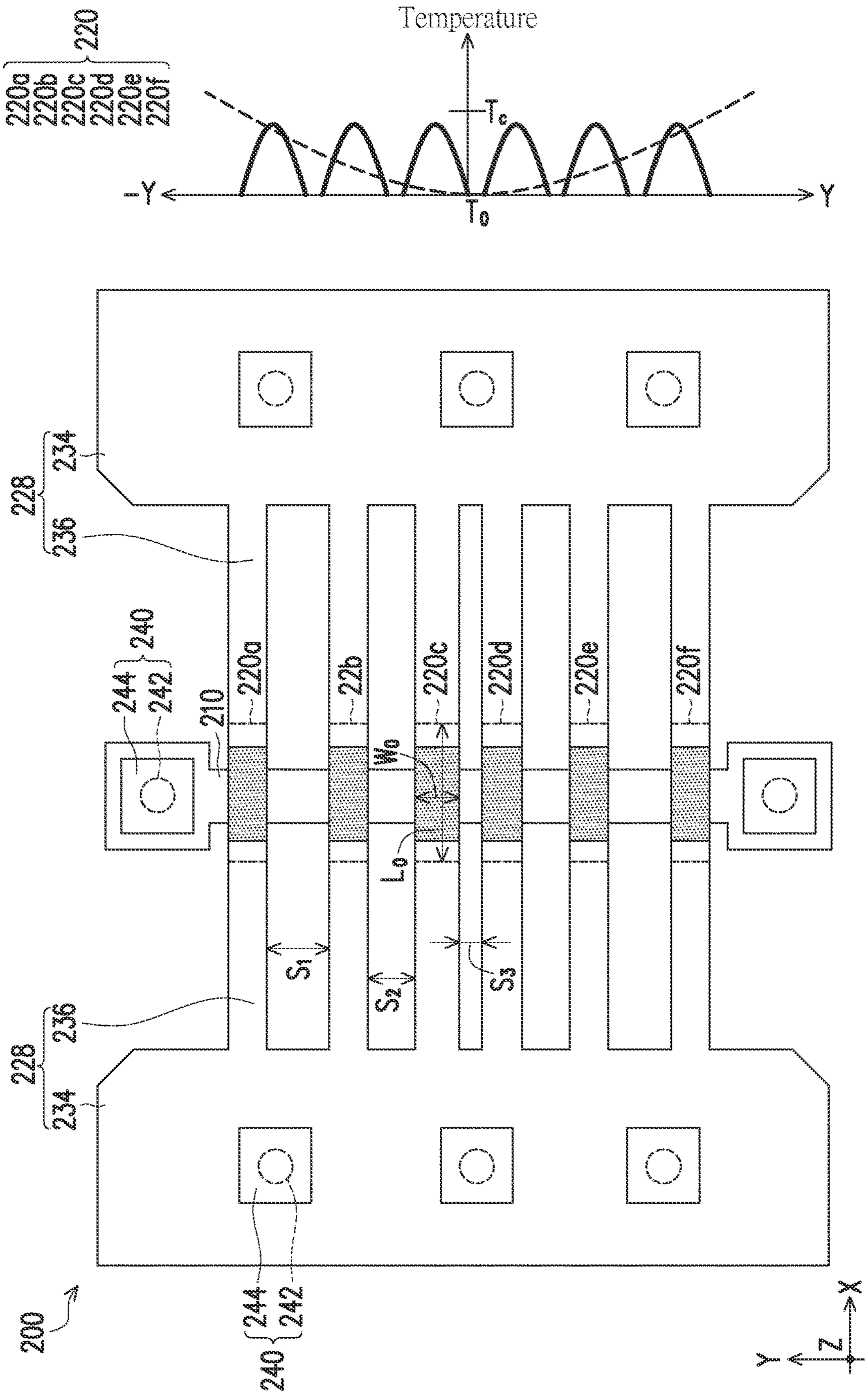

Reference is now made to FIG. 18, which is a top view of an alternative embodiment of the PCM structure 200. Features of the alternative embodiment represented in FIG. 18 are similar to those in FIG. 16, including the temperature gradient map. One difference is that the phase-change element 220 is segmented in a different way, such that the segments have the same size, such as a substantially uniform length $L_0$ and a substantially uniform width $W_0$, but with different edge-to-edge spacings (e.g., spacings $S_1$-$S_3$ as in FIG. 18). In the depicted embodiment, the segments 220*c* and 220*d* have the smallest spacing $S_3$, the segments 220*a* and 220*b* (as well as segments 220*e* and 220*f*) have the largest spacing $S_1$, and the segments 220*b* and 220*c* (as well as segments 220*d* and 220*e*) have the medium spacing $S_2$. This arrangement is to compensate a temperature gradient along the Y direction of the heating element 210 with the highest temperature at the terminal ends of the heating element 210. The larger spacing (e.g., spacing $S_1$) between the segments above the terminal ends of the heating element 210 allows heat accumulated therein to dissipate faster into its surrounding environment. With the various spacings, the temperature gradient along the heating element 210 (and the segments of the phase-change element 220) along the Y direction becomes more evenly distributed and bounded by $T_0$ and $T_c$.

Figure 19:
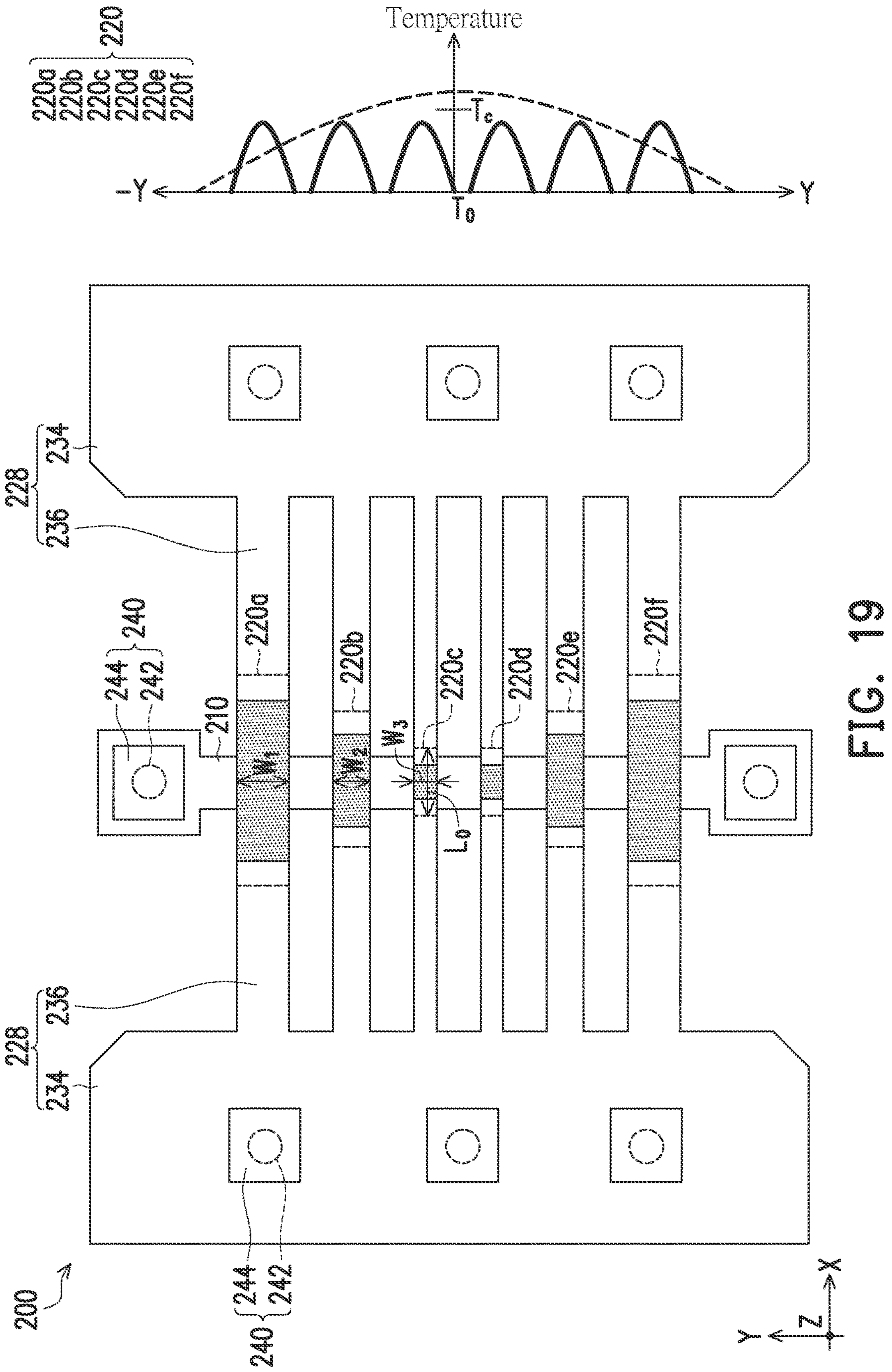

Reference is now made to FIG. 19, which is a top view of an alternative embodiment of the PCM structure 200. Features of the alternative embodiment represented in FIG. 19 are similar to those in FIG. 17, including the temperature gradient map. One difference is that the phase-change element 220 is segmented in a different way, such that the segments have the same size, such as a substantially uniform length $L_0$ and a substantially uniform center-to-center spacing, but different widths along the Y direction (e.g., widths $W_1$-$W_3$ as in FIG. 19). In the depicted embodiment, the segments 220*a* and 220*f* have the largest width $W_1$, the segments 220*c* and 220*d* have the smallest width $W_3$, and the segments 220*b* and 220*e* have the medium width $W_2$. This arrangement is to compensate a temperature gradient along the Y direction of the heating element 210 with the highest temperature at the center portion of the heating element 210. The smallest width (and accordingly the largest edge-to-edge spacing) of the segments above the center portion of the heating element 210 allows heat accumulated therein to dissipate faster into its surrounding environment. With the various widths, the temperature gradient along the heating element 210 (and the segments of the phase-change element 220) along the Y direction becomes more evenly distributed and bounded by $T_0$ and $T_c$. In some embodiments, a ratio of the largest thickness $W_1$ and the smallest thickness $W_3$ (i.e., $W_1/W_3$) ranges from about 1.2:1 to about 3:1, depending on design needs.

Figure 20:
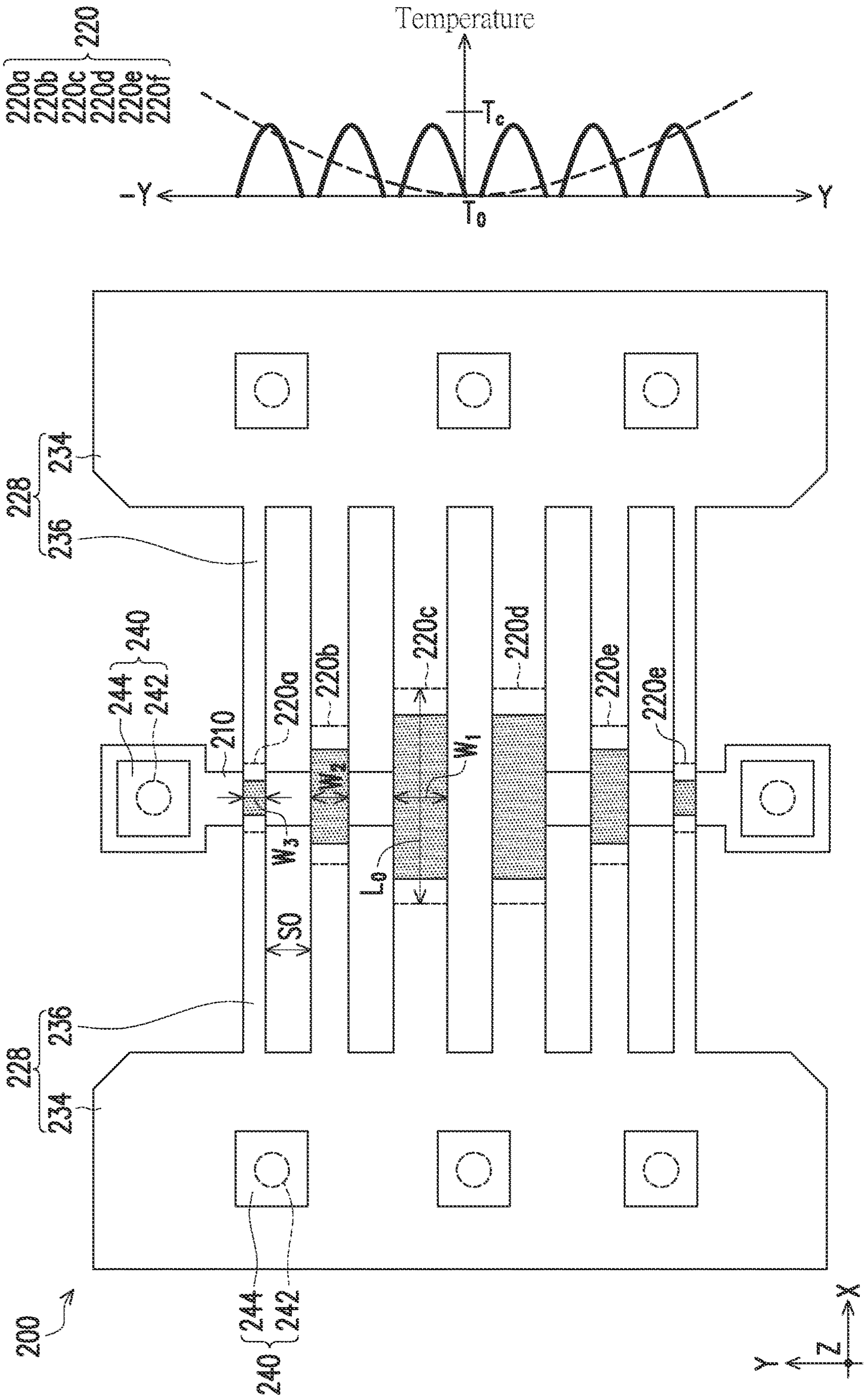

Reference is now made to FIG. 20, which is a top view of an alternative embodiment of the PCM structure 200. Features of the alternative embodiment represented in FIG. 20 are similar to those in FIG. 18, including the temperature gradient map. One difference is that the phase-change element 220 is segmented in a different way, such that the segments have the same size, such as a substantially uniform length $L_0$ and a substantially uniform center-to-center spacing, but different widths along the Y direction (e.g., widths $W_1$-$W_3$ as in FIG. 20). In the depicted embodiment, the segments 220*a* and 220*f* have the smallest width $W_3$, the segments 220*c* and 220*d* have the largest width $W_1$, and the segments 220*b* and 220*e* have the medium thickness $W_2$. This arrangement is to compensate a temperature gradient along the Y direction of the heating element 210 with the highest temperature at the terminal ends of the heating element 210. The smallest width (and accordingly the largest edge-to-edge spacing) of the segments above the terminal ends of the heating element 210 allows heat accumulated therein to dissipate faster into its surrounding environment. With the various widths, the temperature gradient along the heating element 210 (and the segments of the phase-change element 220) along the Y direction becomes more evenly distributed and bounded by $T_0$ and $T_c$.

Figure 21:
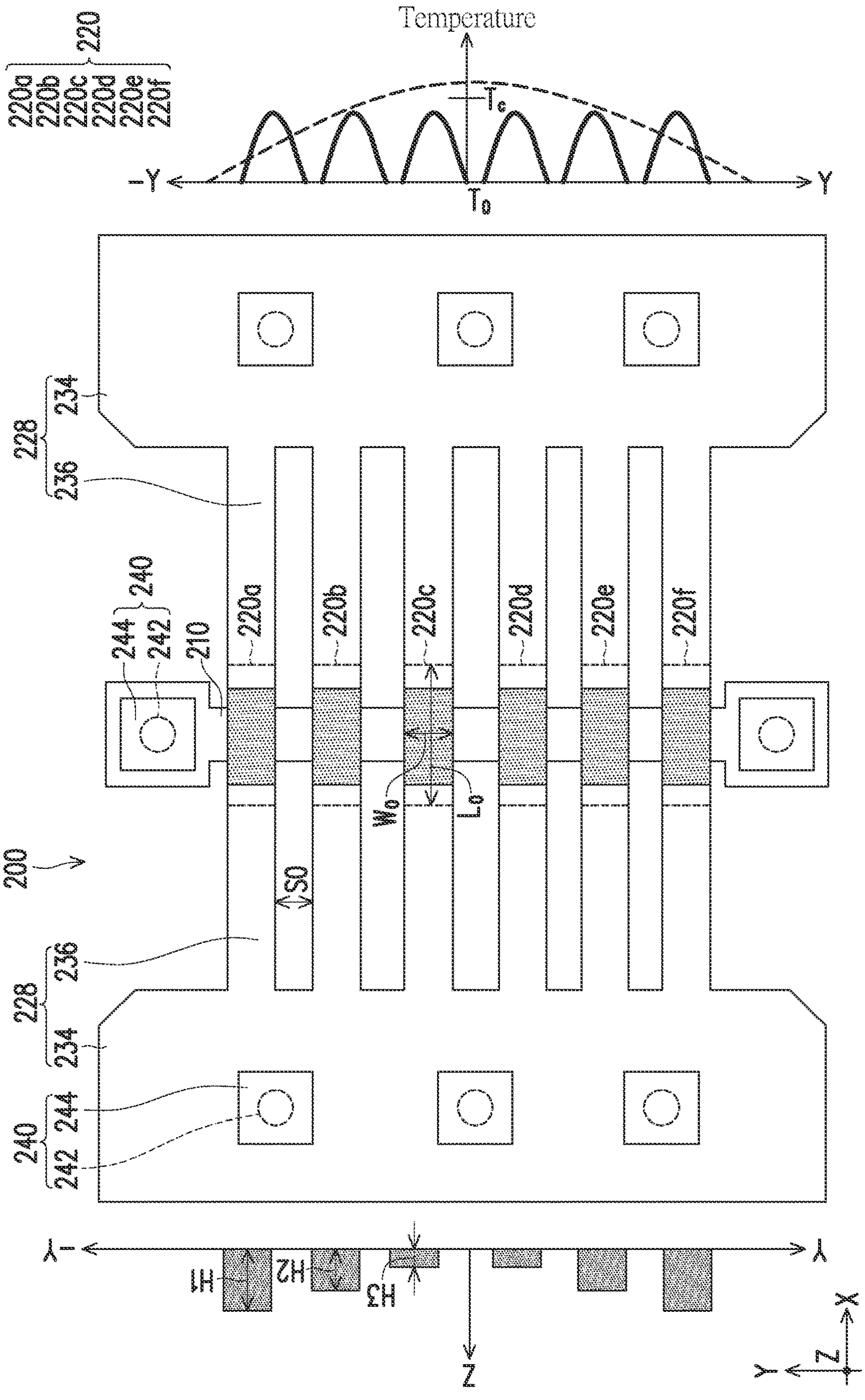

Reference is now made to FIG. 21, which is a top view of an alternative embodiment of the PCM structure 200. Features of the alternative embodiment represented in FIG. 21 are similar to those in FIG. 17, including the temperature gradient map. One difference is that the phase-change element 220 is segmented in a different way, such that segments have the same size, such as a substantially uniform length $L_0$, a substantially uniform width $W_0$, and a substantially uniform edge-to-edge spacing $S_0$, but different thickness along the Z direction (e.g., thicknesses $H_1$-$H_3$ as in FIG. 21). The different thicknesses may be achieved with extra etching process(es) to further thin down certain segments of the phase-change element 220. In the depicted embodiment, the segments 220*a* and 220*f* have the largest thickness $H_1$, the segments 220*c* and 220*d* have the smallest thickness $H_3$, and the segments 220*b* and 220*e* have the medium thickness $H_2$. In other words, the segments 220*a* and 220*f* have the largest volume, the segments 220*c* and 220*d* have the smallest volume, and the segments 220*b* and 220*e* have the medium volume. This arrangement is to compensate a temperature gradient along the Y direction of the heating element 210 with the highest temperature at the center portion of the heating element 210. The smallest volume of the segments above the center portion of the heating element 210 allows heat accumulated therein to dissipate faster into its surrounding environment. With the various thicknesses, the temperature gradient along the heating element 210 (and the segments of the phase-change element 220) along the Y direction becomes more evenly distributed and bounded by $T_0$ and $T_c$. In some embodiments, a ratio of the largest thickness $H_1$ and the smallest thickness $H_3$ (i.e., $H_1/H_3$) ranges from about 1.2:1 to about 3:1, depending on design needs.

Figure 22:
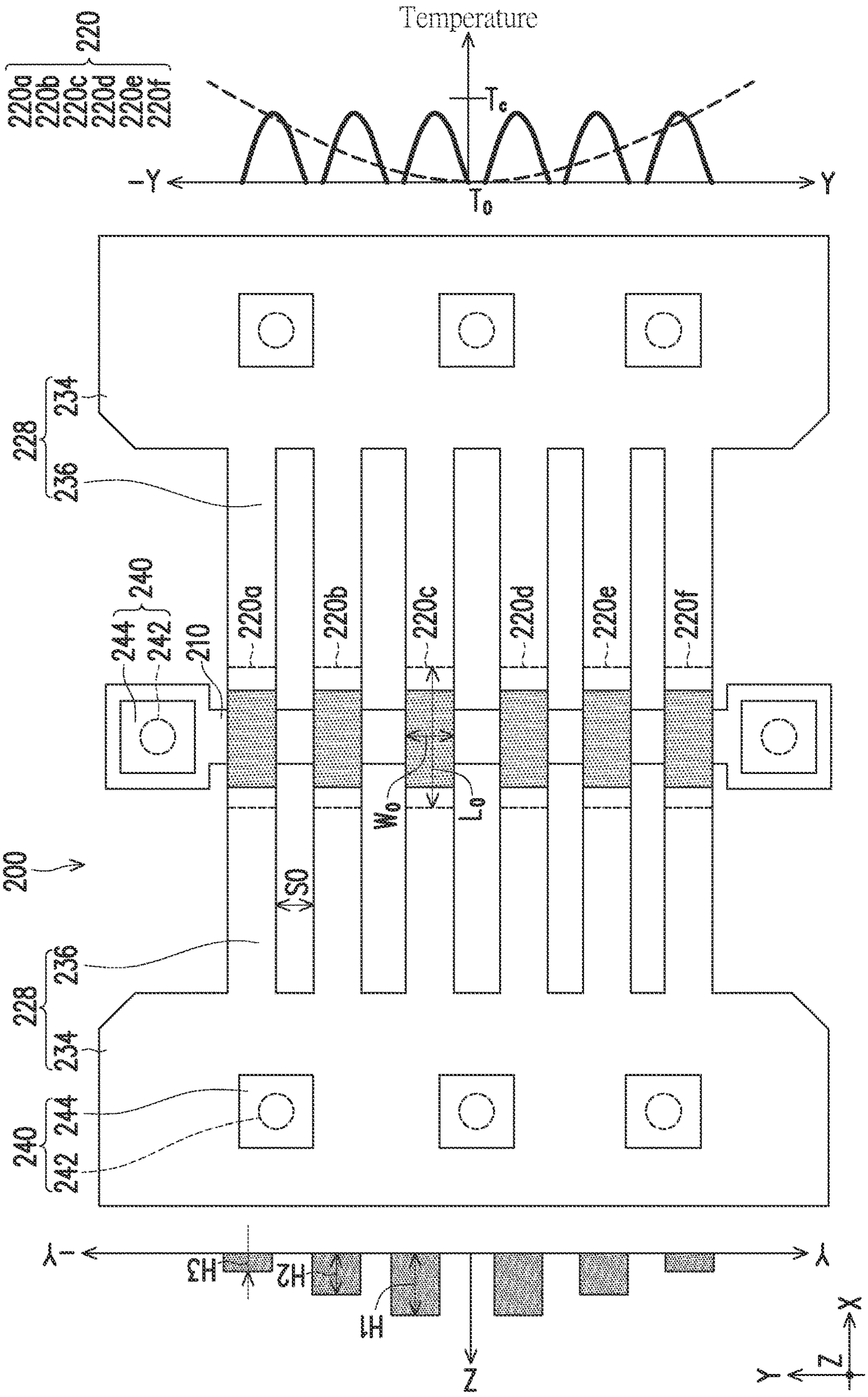

Reference is now made to FIG. 22, which is a top view of another alternative embodiment of the PCM structure 200. Features of the alternative embodiment represented in FIG. 22 are similar to those in FIG. 18, including the temperature gradient. One difference is that the phase-change element 220 is segmented in a different way, such that the segments have the same size, such as a substantially uniform length $L_0$, a substantially uniform width $W_0$, and a substantially uniform edge-to-edge spacing $S_0$, but different thickness along the Z direction (e.g., thicknesses $H_1$-$H_3$ as in FIG. 22). In the depicted embodiment, the segments 220*a* and 220*f* have the smallest thickness $H_3$, the segments 220*c* and 220*d* have the largest thickness $H_1$, and the segments 220*b* and 220*c* have the medium thickness $H_2$. In other words, the segments 220*a* and 220*f* have the smallest volume, the segments 220*c* and 220*d* have the largest volume, and the segments 220*b* and 220*e* have the medium volume. This arrangement is to compensate a temperature gradient along the Y direction of the heating element 210 with the highest temperature at the terminal ends of the heating element 210. The smallest volume of the segments above the terminal ends of the heating element 210 allows heat accumulated therein to dissipate faster into its surrounding environment. With the various thicknesses, the temperature gradient along the heating element 210 (and the segments of the phase-change element 220) along the Y direction becomes more evenly distributed and bounded by $T_0$ and $T_c$.

In the above embodiments as depicted in FIGS. 15 to 22, the implementations of different lengths, widths, edge-to-edge spacings, thicknesses of the segments of the phase-change element 220 can be independently applied alone or in combination. For example, the segments of the phase-change element 220 may simultaneously have different lengths and different thicknesses to more efficiently implement temperature gradient tuning. In another example, the segments of the phase-change element 220 may simultaneously have different lengths and different widths. In yet another example, the segments of the phase-change element 220 may simultaneously have different lengths, different widths, different edge-to-edge spacings, and different thicknesses.

Figure 23:
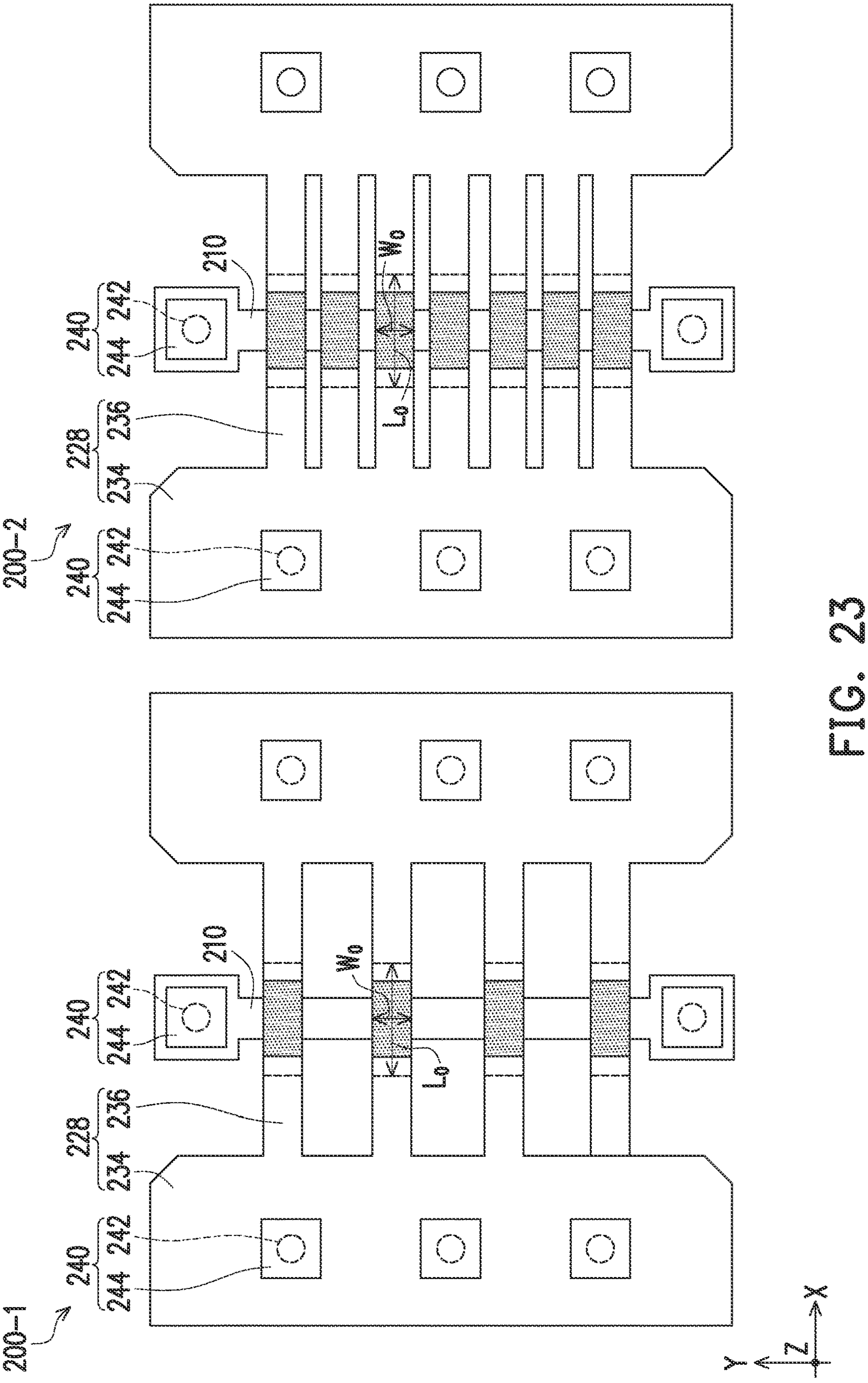

Even a phase-change element 220 may have identical segments, the number of segments translates to different edge-to-edge spacing and may still tune the temperature gradient along the heating element 210. If the temperature gradient along a heating element 210 is overly too high, a phase-change element 220 may use less segments to dissipate heat away faster though larger edge-to-edge spacing. If the temperature gradient along a heating element 210 is overly too low, a phase-change element 220 may use more segments to accumulate heat with smaller edge-to-edge spacing. A semiconductor device may include both structures. FIG. 23 depicts such an embodiment, in which a first PCM structure 200-1 includes a phase-change element 220 with identical but less number of segments and larger edge-to-edge spacing than those of a second PCM structure 200-2. This may be due to the heating element 210 in the first PCM structure 200-1 having an overly too high temperature gradient, and the heating element 210 in the second PCM structure 200-2 having an overly too low temperature gradient.

Figure 24:
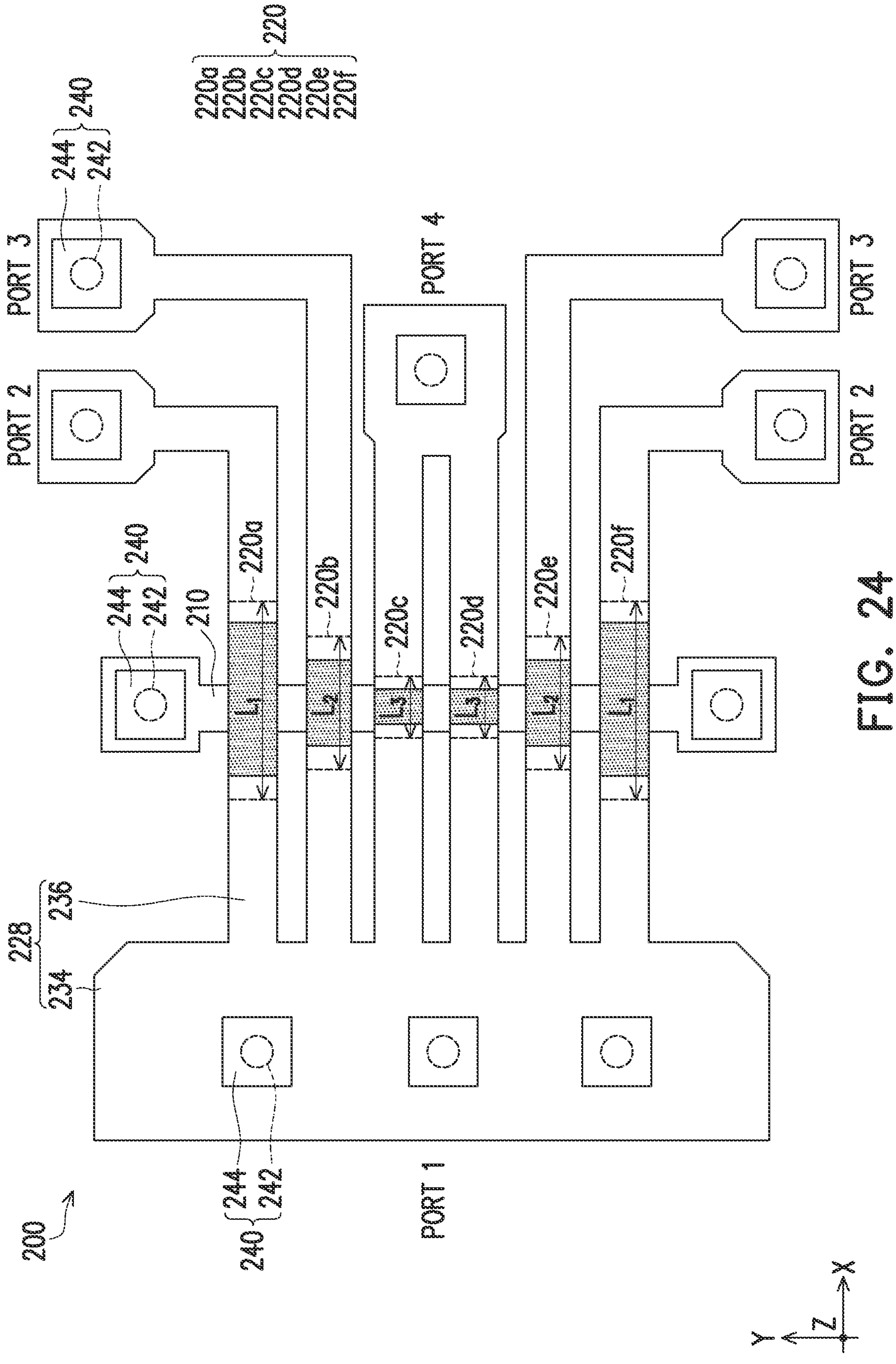

As the segments of a phase-change element 220 may be varied in its sizes, volume, and/or spacings to adjust the temperature gradient along the heating element 210, such adjustment can also be used to adjust ON and OFF sequence of multiple RF paths through different segments. FIG. 24 depicts such an embodiment, in which the extending arms 236 on one side of the phase-change element 220 connect the segments of the phase-change element 220 to a first port, denoted as PORT 1, while the extending arms 236 on the other side of the phase-change element 220 fan out to connect each of the segments to an individual port. Particularly, the segment 220*a* is connected to a second port, denoted as PORT 2, the segment 220*b* is connected to a third port, denoted as PORT 3, the segments 220*c* and 220*d* are connected to a fourth port, denoted as PORT 4, the segment 220*e* is connected to another second port, denoted also as PORT 2, and the segment 220*f* is connected to another third port, denoted also as PORT 3. The segments 220*a*-220*f* may vary in a way such that the temperature gradient causes the ports to turn ON in a sequence from PORT 2 to PORT 3 to PORT 4. Alternatively, the segments 220*a*-220*f* may vary in a way such that the temperature gradient causes the ports to turn ON in a sequence from PORT 4 to PORT 3 to PORT 2. The two PORT 2 are ON and OFF at the same time due to symmetry. The two PORT 3 are ON and OFF at the same time due to symmetry. This configuration of turning on RF paths sequentially may be particularly useful for different RF components to receive RF signal from PORT 1 at different time stamps.

In one exemplary aspect, the present disclosure is directed to a semiconductor structure. The semiconductor structure includes a first electrode and a second electrode disposed over a substrate, a heating element disposed over the substrate, a phase-change material layer disposed over the substrate, and an insulator disposed vertically between the heating element and the phase-change material layer. The phase-change material layer includes at least a first segment and a second segment separated from the first segment; each of the first and second segments overlaps the heating element in a top view; and each of the first and second segments is electrically connected with both the first and second electrodes. In some embodiments, the first and second segments have different sizes in the top view. In some embodiments, the first and second segments have a same width but different lengths. In some embodiments, the first and second segments have a same length but different widths. In some embodiments, the first and second segments have different volumes. In some embodiments, the first and second segments have different thicknesses. In some embodiments, the phase-change material layer also includes a third segment separated from the first and second segments and overlapping the heating element in the top view, the first, second, and third segments are disposed in sequence along a lengthwise direction of the heating element, and an edge-to-edge spacing between the first and second segments is different from that between the second and third segments. In some embodiments, each of the first and second electrodes includes at least a first extending arm in contact with the first segment and a second extending arm in contact with the second segment, and a common portion connecting the first and second extending arms. In some embodiments, a width of the first extending arm equals a width of the first segment, and a width of the second extending arm equals a width of the second segment. In some embodiments, the heating element is vertically disposed between the substrate and the phase-change material layer. In some embodiments, the phase-change material layer is vertically disposed between the substrate and the heating element.

In another exemplary aspect, the present disclosure is directed to a semiconductor structure. The semiconductor structure includes a first electrode and a second electrode spaced apart from one another along a first direction, a phase-change material layer spanning over and in contact with the first electrode and the second electrode, the phase-change material layer including a plurality of segments spaced apart from one another along a second direction perpendicular to the first direction, a metal feature overlapping the phase-change material layer, the metal feature extending lengthwise along the second direction, and an insulator disposed vertically between the phase-change material layer and the metal feature. In some embodiments, each of the segments extends lengthwise along the first direction. In some embodiments, the segments vary in lengths measured along the first direction. In some embodiments, the segments vary in widths measured along the second direction. In some embodiments, the segments vary in spacings between adjacent two of the segments. In some embodiments, the semiconductor structure further includes a third electrode spaced apart from the first electrode and the second electrode, each of the segments being in contact with the first electrode, a first portion of the segments being in contact with the second electrode, and a second portion of the segments being in contact with the third electrode.

In yet another exemplary aspect, the present disclosure is directed to a method. The method includes depositing a first metal layer over a substrate, patterning the first metal layer to form a heating element, depositing a phase-change material layer over the substrate, patterning the phase-change material layer, such that the patterned phase-change material layer has segments overlapping the heating element, the segments being spaced apart from one another, depositing a second metal layer over the substrate, and patterning the second metal layer to form a first electrode and a second electrode, the patterned phase-change material layer being in contact with both the first and second electrodes. In some embodiments, the heating element extends lengthwise along a first direction, and the segments are spaced apart from one another along the first direction. In some embodiments, the segments vary in lengths, widths, thicknesses, volumes, or spacings.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a first electrode and a second electrode disposed over a substrate;
 a heating element disposed over the substrate;
 a phase-change material layer disposed over the substrate; and
 an insulator disposed vertically between the heating element and the phase-change material layer,
 wherein the phase-change material layer includes at least a first segment and a second segment separated from the first segment, each of the first and second segments overlaps the heating element in a top view, and each of the first and second segments is electrically connected with both the first and second electrodes,
 wherein the first and second segments have different sizes in the top view.

2. The semiconductor structure of claim 1, wherein the first and second segments have a same width but different lengths.

3. The semiconductor structure of claim 1, wherein the first and second segments have a same length but different widths.

4. The semiconductor structure of claim 1, wherein the first and second segments have different volumes.

5. The semiconductor structure of claim 1, wherein the first and second segments have different thicknesses.

6. The semiconductor structure of claim 1, wherein the phase-change material layer also includes a third segment separated from the first and second segments and overlapping the heating element in the top view, the first, second, and third segments are disposed in sequence along a lengthwise direction of the heating element, and an edge-to-edge spacing between the first and second segments is different from that between the second and third segments.

7. The semiconductor structure of claim 1, wherein each of the first and second electrodes includes at least a first extending arm in contact with the first segment and a second extending arm in contact with the second segment, and a common portion connecting the first and second extending arms.

8. The semiconductor structure of claim 7, wherein a width of the first extending arm equals a width of the first segment, and a width of the second extending arm equals a width of the second segment.

9. The semiconductor structure of claim 1, wherein the heating element is vertically disposed between the substrate and the phase-change material layer.

10. The semiconductor structure of claim 1, wherein the phase-change material layer is vertically disposed between the substrate and the heating element.

11. A semiconductor structure, comprising:
 a first electrode and a second electrode spaced apart from one another along a first direction;
 a phase-change material layer spanning over and in contact with the first electrode and the second electrode, wherein the phase-change material layer includes a plurality of discrete segments spaced apart from one another along a second direction perpendicular to the first direction;
 a metal feature overlapping the phase-change material layer, wherein the metal feature extends lengthwise along the second direction; and an insulator disposed vertically between the phase-change material layer and the metal feature.

12. The semiconductor structure of claim 11, wherein each of the discrete segments extends lengthwise along the first direction.

13. The semiconductor structure of claim 11, wherein the discrete segments vary in lengths measured along the first direction.

14. The semiconductor structure of claim 11, wherein the discrete segments vary in widths measured along the second direction.

15. The semiconductor structure of claim 11, wherein the discrete segments vary in spacings between adjacent two of the discrete segments.

16. The semiconductor structure of claim 11, further comprising:

a third electrode spaced apart from the first electrode and the second electrode, wherein each of the discrete segments is in contact with the first electrode, a first portion of the discrete segments is in contact with the second electrode, and a second portion of the discrete segments is in contact with the third electrode.

17. A semiconductor structure, comprising:

a heating element disposed over a substrate, the heating element extending lengthwise along a first direction;

a plurality of discrete phase-change elements disposed over the heating element and spaced apart from one another along the first direction, wherein measured along a second direction perpendicular to the first direction a dimension of a center one of the discrete phase-change elements is different from a dimension of an edge one of the discrete phase-change elements;

a first electrode and a second electrode spaced apart from one another along the second direction, wherein each of the discrete phase-change elements connects the first electrode to the second electrode;

a first contact landing on the first electrode; and a second contact landing on the second electrode.

18. The semiconductor structure of claim 17, wherein the first electrode includes a plurality of arms extending from a common portion, each of the arms connected to a corresponding one of the discrete phase-change elements.

19. The semiconductor structure of claim 17, wherein measured along the second direction the dimension of the center one of the discrete phase-change elements is smaller than the dimension of the edge one of the discrete phase-change elements.

20. The semiconductor structure of claim 17, wherein the heating element is a metal feature.

* * * * *